(12) United States Patent
Shulman et al.

(10) Patent No.: US 12,313,705 B2
(45) Date of Patent: May 27, 2025

(54) SYSTEM AND METHOD FOR CANCELLING A CONTINUALLY VARYING ELECTROMAGNETIC FIELD IN A PASSENGER CABIN

(71) Applicant: SAFEFIELDS TECHNOLOGIES LTD, Herzliya (IL)

(72) Inventors: Shaul Shulman, Ramat Gan (IL); Bernard Arambepola, Enfield Greater London (GB); Oded Ei-Nat, Herzliya (IL)

(73) Assignee: Safefields Technologies LTD, Herzliya (IL)

( * ) Notice: Subject to any disclaimer, the term of this patent is extended or adjusted under 35 U.S.C. 154(b) by 0 days.

(21) Appl. No.: 18/653,741

(22) Filed: May 2, 2024

(65) Prior Publication Data

US 2024/0282496 A1    Aug. 22, 2024

Related U.S. Application Data

(63) Continuation of application No. PCT/IL2022/051161, filed on Nov. 3, 2022.

(30) Foreign Application Priority Data

Nov. 4, 2021  (IL) .......................................... 287834
Apr. 13, 2022  (IL) .......................................... 292255

(51) Int. Cl.
  *G01R 33/00* (2006.01)
  *B60L 3/00* (2019.01)
  (Continued)

(52) U.S. Cl.
  CPC ........ *G01R 33/0023* (2013.01); *B60L 3/0061* (2013.01); *B60N 2/90* (2018.02);
  (Continued)

(58) Field of Classification Search
  CPC .................................................. G01R 33/0023
  See application file for complete search history.

(56) References Cited

U.S. PATENT DOCUMENTS 5,616,969 A    4/1997   Morava
5,920,130 A    7/1999   Paschen et al.
(Continued)

FOREIGN PATENT DOCUMENTS

EP    3305579 A1    4/2018
EP    3744609 A1 *  12/2020   .............. B60L 13/04
(Continued)

OTHER PUBLICATIONS

International Search Report and Written Opinion for International Application No. PCT/IL2022/051161, dated Nov. 3, 2022, 11 pages.
(Continued)

*Primary Examiner* — Imran K Mustafa
(74) *Attorney, Agent, or Firm* — Finnegan, Henderson, Farabow, Garrett & Dunner LLP

(57) ABSTRACT

System, method, and computer readable medium are disclosed for reducing a time-varying undesired magnetic field in a passenger compartment of a vehicle. Reducing a time-varying undesired magnetic field in a passenger compartment of a vehicle includes a magnetic field source for transmitting time-varying currents resulting in the time-varying undesired magnetic field in the passenger compartment including a selected region suitable for presence of people; a sensor for detecting the time-varying undesired magnetic field and to provide sensing data; a magnetic field generator for generating a time-varying cancellation magnetic field in the selected region; a circuit for receiving the associated sensing data; determining the time-varying cancellation magnetic field from the associated sensing data; and transmitting signals to the magnetic field generator to thereby generate the time-varying cancellation magnetic
(Continued)

field for at least reducing the time-varying undesired magnetic field.

20 Claims, 15 Drawing Sheets

(51) Int. Cl.
| | | |
|---|---|---|
| *B60N 2/90* | (2018.01) | |
| *B60R 16/023* | (2006.01) | |
| *G01R 33/07* | (2006.01) | |
| *H01F 7/06* | (2006.01) | |
| *H01F 7/20* | (2006.01) | |
| *H01F 27/34* | (2006.01) | |
| *H05K 9/00* | (2006.01) | |

(52) U.S. Cl.
CPC ........ *B60R 16/023* (2013.01); *G01R 33/0094* (2013.01); *H01F 7/064* (2013.01); *H01F 7/20* (2013.01); *H01F 27/34* (2013.01); *H05K 9/0071* (2013.01); *B60N 2210/14* (2023.08); *G01R 33/07* (2013.01)

(56) References Cited

U.S. PATENT DOCUMENTS

| | | |
|---|---|---|
| 9,030,197 B1 | 5/2015 | Meske et al. |
| 2007/0193811 A1 | 8/2007 | Breed et al. |
| 2011/0144953 A1 | 6/2011 | Kropp |
| 2013/0127456 A1 | 5/2013 | Hebiguchi |
| 2014/0097957 A1 | 4/2014 | Breed et al. |
| 2016/0164252 A1 | 6/2016 | Parsa et al. |
| 2017/0264229 A1 | 9/2017 | Murata et al. |
| 2022/0065952 A1* | 3/2022 | Tsin .................. G01R 33/0206 |

FOREIGN PATENT DOCUMENTS

| | | |
|---|---|---|
| JP | 2011146621 A | 7/2011 |
| JP | 2021188976 A | 12/2021 |
| KR | 20120082770 A | 7/2012 |

OTHER PUBLICATIONS

International Search Report and Written Opinion for International Application No. PCT/IL2023/050225, dated Mar. 6, 2023, 9 pages.
International Search Report and Written Opinion for International Application No. PCT/IB2024/055491 mailed Oct. 16, 2024, 11 pages.

* cited by examiner

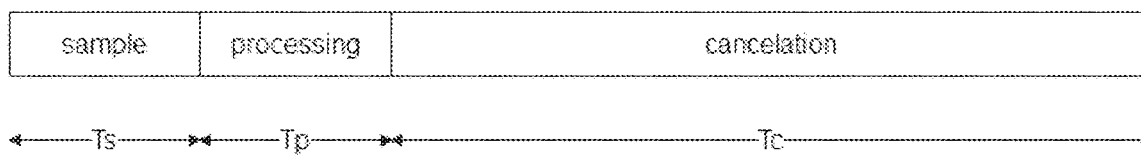
FIG. 7
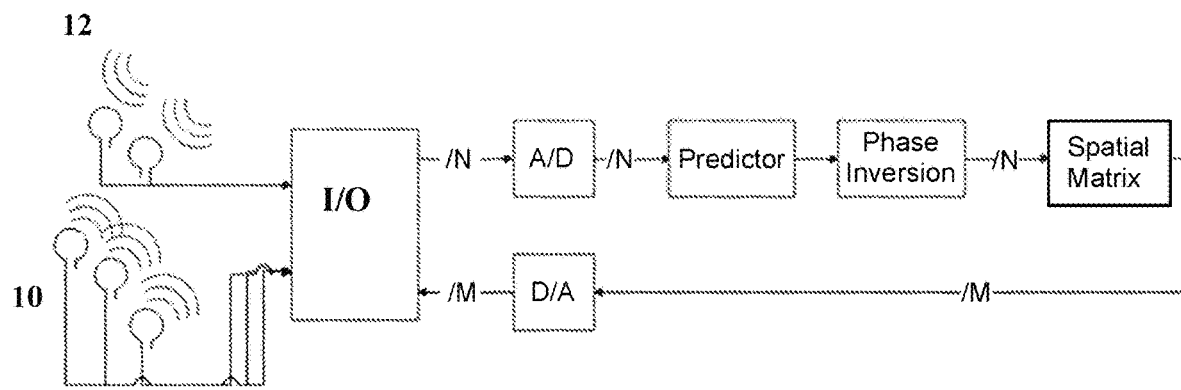
FIG. 8A
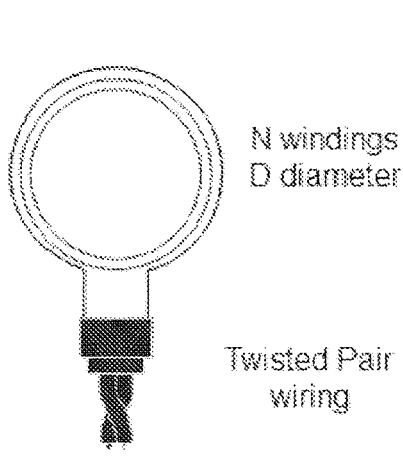 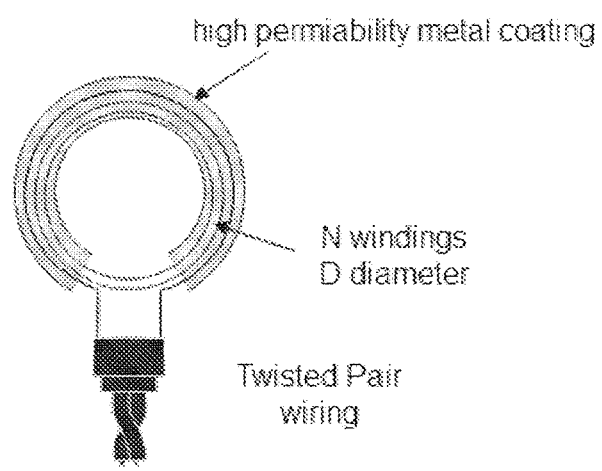
FIG. 9A                                   FIG. 9B

SYSTEM AND METHOD FOR CANCELLING A CONTINUALLY VARYING ELECTROMAGNETIC FIELD IN A PASSENGER CABIN

CROSS REFERENCE TO RELATED APPLICATIONS

This application is a continuation of International Application No. PCT/IL2022/051161, filed on Nov. 3, 2022, which claims the benefit of priority to IL 287834, filed on Nov. 4, 2021, and to IL 292255, filed on Apr. 13, 2022, all of which are incorporated herein by reference.

TECHNOLOGICAL FIELD

The present disclosure is in the field of radiation shielding systems and techniques and relates to techniques for active cancellation or reduction of time-varying magnetic fields.

BACKGROUND

Electromagnetic radiation, and general electromagnetic fields surrounding human environment is increasing with the use of electrical tools. Electric vehicles utilize electricity operating motors for transmitting power to the wheels and additional electrical elements that operate the vehicle.

Various other scenarios and applications may require the ability for nullifying or significantly reducing electromagnetic fields (EMF) or electromagnetic radiation in certain regions. According to medical research, low frequency magnetic radiation is believed to cause long-term adverse health effects. In the example of electric automobiles/vehicle, reducing the EMF radiation in the area of the passengers' seats may be desired.

GENERAL DESCRIPTION

The present disclosure provides a system and technique for eliminating, or at least significantly reducing, electromagnetic fields in a selected region. The present disclosure may be specifically suitable for eliminating, or at least significantly reducing time-varying electromagnetic, or magnetic, fields. Such magnetic and electromagnetic fields may be generated by one or more magnetic field sources, generally external to the system of the present disclosure, where electrical current and/or one or more magnets are operated. For example, source of undesired electromagnetic field may be associated with operation of electric or hybrid electric vehicle, by operation of an electric motor, high currents transmitted through electrical wiring etc.

The present technique is specifically directed at reducing magnetic fields in one or more selected regions, by determining pattern of the magnetic field generated by one or more external sources that is to be canceled, and generating, using one or more magnetic field generators, magnetic fields having opposite direction and same or similar magnitude over time and space. Generally, the magnetic field within the selected region is not spatially uniform and may also vary in time. The present technique utilizes one or more magnetic field generators configured to be positioned around the selected region, one or more magnetic field sensors configured for sensing magnetic fields in at least a portion of, or in vicinity to, said selected region, and a control system. The control system is operatively connectable to said one or more magnetic field generators and magnetic field sensors. The control system is further configured for receiving sensing data on sensed magnetic field from the one or more magnetic field sensors, processing the sensing data and determining one or more parameters of a cancellation magnetic field, and operating the one or more magnetic field generators for generating said cancellation magnetic field. The cancellation magnetic field is generally determined as a magnetic field pattern that is similar in magnitude and opposite in direction to magnetic field generated by one or more external sources. Such external sources may include various magnetic field sources. In the general frame of electric vehicles such external sources may include, for example: electric motor, electrical transmission lines, DC-AC current and/or voltage inverter, or other electrical elements in a vehicle.

Typically, in some embodiments of the present disclosure, the control system according to the present disclosure may operate as a feedback control system for cancelling magnetic fields in the selected region. More specifically, the control system may operate to minimize magnetic field sensed by the one or more sensors, or certain relation between magnetic field data collected by two or more sensors. Generally, the sensing data collected by the one or more magnetic field sensors may be associated with residual magnetic field, formed of external magnetic field and cancellation magnetic field generated by the one or more magnetic field generators. Accordingly, operation of the control system provides for minimizing a selected function associated with the detected magnetic field.

More specifically, the magnetic field generators, operated by the system of the present disclosure, generate magnetic fields, typically directed in opposite to external magnetic field. This magnetic field is included in the sensing data and thus needs to be considered in determining cancellation field. The magnetic field sensors are generally placed in vicinity or around the selected region, while oriented along selected direction to enable cancellation of vector magnetic field. Specifically, each sensor generally collects data on magnetic field flux through a respective surface/aperture defined by arrangement of the sensor. Thus, selected number of sensors are arranged along generally intersecting planes for providing sensing data on magnetic field along two or more, and preferably three axes. It should be noted that various sensors and/or magnetic field generators may be positioned at angles other than orthogonal between them, and a selected number of magnetic field sensors and/or generators may be used to cover various directions of magnetic fields.

Further, the feedback control may also operate in accordance with effects of time-varying electromagnetic field on response function the magnetic field generators. More specifically, variation in electromagnetic flux through the magnetic field generators generally induce current therethrough. The feedback control according to the present disclosure utilizes data on magnetic field for estimating induced current and adjusting electrical current provided to the magnetic field generator to optimize field cancellation.

Additionally, or alternatively, the control system may be operable in a feed-forward scheme, using processing of input data indicative of magnetic fields and transmitted currents within an associated electrical system to estimate magnetic fields. Using such estimation, the control system may operate the one or more magnetic field generators for generating cancellation field at the selected region.

As indicated above, the present technique may be operable in a vehicle, e.g., electric or hybrid electric vehicle, where electric motor, and other electrical systems generate magnetic fields within passenger's cabin of the vehicle.

The present technique utilizes a generally active field cancellation technique. This enables a generally broadband cancellation of time-varying magnetic field, typically up to tens of KHz, and generally spatially non-uniform. This is advantageous over magnetic shielding methods, which are generally costly, require complete, or almost complete enclosure, are limited and set during the enclosure design. Also, shielding arrangement cannot be altered using signal processing or any other "soft" methods. In addition, high permeability material is subject to saturation due to external magnetic fields, such as earth's magnetic field, which further degrades the shielding effectiveness. Additional techniques use faraday cages directed at shielding from high frequency electromagnetic radiation such as RF radiation.

Thus, according to a broad aspect, the present disclosure provides a system comprising:
one or more magnetic field generators configured to be positioned around a selected region,
one or more magnetic field sensors configured to provide sensing data indicative of a magnetic field in said selected region,
and a control system;
the control system being operatively connectable to said one or more magnetic field generators and magnetic field sensors, and configured for:
receiving said sensing data on the magnetic field in said selected region,
processing the sensing data and determining one or more parameters of a cancellation magnetic field for cancelling or at least significantly reducing a magnitude of the magnetic field in said selected region and operating said one or more magnetic field generators for generating said cancellation magnetic field.

Generally, the one or more magnetic field sensors may be configured to provide sensing data on magnetic field in at least a portion of the selected region.

According to some embodiments, the one or more magnetic field generators may comprise two or more magnetic field generators positioned to generate magnetic fields within said selected region with magnetic field vectors being along two or more intersecting axes within said selected region.

According to some embodiments, the one or more magnetic field generators may comprise three or more magnetic field generators positioned and oriented to generate magnetic fields having magnetic field vectors being along three or more intersecting axes within said selected region, thereby enabling generation of magnetic field in three-dimensional span within said selected region.

According to some embodiments, the system may comprise an arrangement of one or more magnetic field generators spatially overlapping with respective one or more magnetic field sensors, thereby providing magnetic field cancellation and minimizing magnetic field flux through said one or more magnetic field sensors.

Further, in some embodiments the system may comprise additional one or more magnetic field generators, positioned at a selected distance from said arrangement of magnetic field generator spatially overlapping respective magnetic field sensor, and wherein said control system is configured to apply feedback control for determining cancellation magnetic field generated by said one or more magnetic field generators and said additional one or more magnetic field generator, having selected feedback gain parameters, to thereby selectively minimize magnetic field flux at a selected region between said one or more magnetic field generator and said additional one or more magnetic field generator.

The one or more magnetic field generators and said additional one or more magnetic field generators may be positioned at two sides of said selected region. Additionally, or alternatively, the one or more magnetic field generators and said additional one or more magnetic field generators may be positioned at two opposite sides of said selected region.

According to some embodiments, the control system may be adapted for receiving input reference data indicative of magnetic field at one or more positions and process said reference data for estimating magnetic field variations within the selected region in accordance with pre-stored reference data. The control system may be configured for combined processing of magnetic field data using feedback processing in accordance with sensing magnetic field data and utilize estimation based on input reference and pre-stored calibration data.

According to some embodiments, the control system comprises at least one integrator module, configured and operable for integrating voltage signals provided from said one or more magnetic field sensors, to thereby determine said sensing data indicative of magnetic field flux through said one or more magnetic field sensors.

In yet some embodiments, the control system is configured for processing said sensing data in accordance with one or more pre-stored parameters indicative of magnetic field induction between said one or more magnetic field generators and said one or more magnetic field sensors, to determine output current transmitted to said one or more magnetic field generators.

According to some embodiments, the system may comprise one or more magnetic cancellation channels, each comprising at least one magnetic field generator. The control system may comprise pre-stored data on at least one of inductance and resistance of said magnetic field generators and may be configured to use said pre-stored data for pre-equalization of electrical signals directed to the said magnetic field generators, thereby generating cancellation magnetic field proportional to external magnetic field. The electrical signals may be characterized by voltage profile and may be determined in accordance with resistance, inductance (and possibly capacitance) of the magnetic field generators and corresponding electrical wires, to generate desired electrical current and accordingly desired cancellation magnetic field.

In some further embodiments, the control system is configured and operable for determining output current transmitted to said one or more magnetic field generators, said determining output current comprises determining data in electrical current induced through said one or more magnetic field generators in response to magnetic field flux variation through said one or more magnetic field generators, said magnetic field flux variations is associated with variation in external magnetic field and variation in cancellation magnetic field generated by one or more other magnetic field generators.

According to some embodiments, one or more of said one or more magnetic field generators may be operable as said one or more magnetic field sensors using time division duplex operation. In this connection the system may operate in operation cycles including sample/sensing period, processing period, and generating period in which the magnetic field generators are operated for generating cancelation magnetic field.

According to some embodiments, the control system comprises:

one or more processors and a memory unit, said memory unit is pre-stored with calibration data comprising calibration data indicative of a magnetic field pattern generated by said one or more magnetic field generators in response to respective operation electric currents transmitted therethrough, said one or more processors are configured to:

receive sensing data on the magnetic field detected by said one or more magnetic field sensors, process the sensing data on said magnetic field and, determine said one or more parameters of the cancellation magnetic field utilizing said calibration data, said one or more parameters comprising output electric current pattern to be transmitted to said one or more magnetic field generators to thereby generate said cancellation magnetic field.

According to some embodiments, the one or more processors are configured for utilizing output electric current data indicative of an electric current provided to said one or more magnetic field generators, said calibration data and sensing data from said one or more magnetic field sensors for determining an external magnetic field pattern corresponding with a portion of magnetic field generated by one or more sources external to said system.

According to some embodiments, the system may be configured to be used in a range of one or more predetermined external magnetic field sources, wherein said memory unit comprises pre stored field data indicative of a time-varying pattern of a magnetic field generated by said one or more external sources and affecting said selected region, said one or more processors being configured for processing sensing data obtained from said one or more sensors at a sensing time period, and using said pre-stored field data, determine, generally by computing, an estimation of the magnetic field generated by the one or more external sources at a cancelling time period subsequent to the sensing time period, to thereby determine said one or more parameters for generating said cancellation magnetic field for cancelling or at least significantly reducing a magnitude of the magnetic field in said selected region at the cancelling time period. Generally, one or more magnetic field sources may generate varying magnetic field having a typical time profile. e.g., rotating magnetic field, estimation of magnetic field generation at a cancelation time period may comprise utilizing calibration data on typical variation of magnetic field generated by one or more sources in accordance with length of operation cycle and periods thereof. To this end, according to some embodiments, the pre stored field data may be indicative of the time varying pattern of magnetic field comprises data indicative of a generally rotating magnetic field portion.

The control system may also be configured to determine in real time, a set of calibration coefficients for use, out of a selected pre-stored sets of coefficients. The decision is based on detecting a change in the spatial pattern of the magnetic field that indicated magnetic radiation emitted from one or more different sources. For example, one source may operate, emitting magnetic field, and at certain time another source may be kicking in or out of operation, varying the general pattern of the magnetic field. The calibration data may comprise of one or more sets of calibration coefficients associated with operation of one or more different magnetic field sources for which the calibration data is assigned.

According to some embodiments, one or more of said one or more magnetic field generators may be operable as said one or more magnetic field sensors using time division duplex operation defining one or more combined sensor generator units, said control system being configured for operating said one or more combined sensor generator units for sensing magnetic field flux therethrough in a first period of operation cycle, processing sensing data on detected magnetic flux in a second period of operation cycle, and operating said one or more magnetic field generators for generating cancellation magnetic field in a third period of operation cycle.

According to some embodiments, at least one of said one or more magnetic field generators is configured of a coil of effective diameter D and carrying N windings. In some embodiments, the magnetic field generators may be generally similarly wrapped coils.

According to some embodiments, the one or more coils are covered by high permeability metal coating, thereby reducing magnetic field in close proximity to said coil, while maintaining far field effects on the magnetic field.

According to some embodiments, the one or more magnetic field generators may be formed of a coil having generally circular shape.

According to some embodiments, the one or more magnetic field generators may be formed of a coil having generally oval shape.

According to some embodiments, the one or more magnetic field generators may be formed of a coil having generally polygonal shape. Design and shape of the one or more magnetic field generators may be selected in accordance with characteristic spatial radiation pattern for selected one or more magnetic field external sources and the characteristics and location of one or more target areas for magnetic fields cancelation or reduction.

According to some embodiments, the system may be configured to be placed in a vehicle, the system being operated for reducing effective magnetic field generated by components of said vehicle in a selected region comprising at least a portion of driver or passenger occupying region of said vehicle. The vehicle may be at least partially operated by one or more electric motors.

According to some embodiments, the system may be configured to be mounted in a selected front and/or rear seat of a vehicle.

According to some embodiments, the system may be configured as integral part of a vehicle.

According to some embodiments, the system may be configured to be mounted in a child safety seat, or in a child or baby bed.

According to one other broad aspect, the present disclosure provides an electric vehicle (EV or HEV) comprising a system for cancellation or at least significant reduction of magnetic fields; the system comprises:

one or more magnetic field generators configured to be positioned around a selected region of the electric vehicle, one or more sensors configured to provide sensing data on magnetic fields in at least a portion of said selected region, and a control system;

the control system being operatively connectable to said one or more magnetic field generators and magnetic field sensors, and configured for:

receiving said sensing data on the magnetic field in said selected region, processing the sensing data and determining one or more parameters of a cancellation magnetic field for cancelling or at least significantly reducing a magnitude of the magnetic field in said selected region and operating said one or more magnetic field generators for generating said cancellation magnetic field.

According to yet another broad aspect, the present disclosure provides a safety seat for use in a vehicle, comprising a system for cancellation or at least significant reduction of magnetic field s; the system comprises:
one or more magnetic field generators configured to be positioned around a selected region of the safety seat,
one or more sensors configured to provide sensing data on magnetic fields in at least a portion of said selected region,
and a control system;
the control system being operatively connectable to said one or more magnetic field generators and magnetic field sensors, and configured for:
receiving said sensing data on the magnetic field in said selected region,
processing the sensing data and determining one or more parameters of a cancellation magnetic field for cancelling or at least significantly reducing a magnitude of the magnetic field in said selected region and operating said one or more magnetic field generators for generating said cancellation magnetic field.

According to a further broad aspect, the present disclosure provides a method for reducing magnitude of magnetic field within a selected region, the method comprising: installing one or more magnetic field sensors and one or more magnetic field generators in vicinity of said selected region, collecting sensing data processing sensing data on magnetic flux passing through said magnetic field sensors and processing said sensing data and determining a magnetic field pattern within said selected region generated by one of or more external sources, determining cancellation magnetic field pattern for cancelling or at least significantly reducing magnitude of magnetic field through said selected region and operating said one or more magnetic field generators for generating said magnetic field cancellation pattern.

According to some embodiments at least one of said one or more magnetic field sensors and one or more magnetic field generators may be a common magnetic field sensing and generating unit, the method comprises operating said at least one common magnetic field sensing and generating unit in time division duplex for sensing magnetic field flux therethrough in a first period of operation cycle, processing data on detected magnetic flux in a second period of operation cycle, and operating said one or more magnetic field generators for generating cancellation magnetic field in a third period of operation cycle.

According to some embodiments said collecting sensing data on magnetic flux from said one or more magnetic field sensors and operating said one or more magnetic field generators for generating cancellation magnetic field pattern may be performed simultaneously; said processing comprises determining pattern of sensed magnetic field, detected by said one or more magnetic field sensors, determining pattern of internally generated magnetic field generated by said one or more magnetic field generators, and subtracting said internally generated magnetic field from said sensed magnetic field, to thereby determine pattern of externally generated magnetic field.

According to a further broad aspect, the present disclosure provides a method for reducing magnitude of magnetic field within a selected region, the method comprising: installing one or more magnetic field sensors and one or more magnetic field generator in vicinity of said selected region, collecting and processing sensing data on magnetic flux passing through said magnetic field sensors and operating said one or more magnetic field generators for generating cancellation magnetic field for cancelling or at least significantly reducing magnitude of magnetic field through said selected region and operating said one or more magnetic field generators for generating said magnetic field cancellation pattern.

According to some embodiments, at least one of said one or more magnetic field sensors and one or more magnetic field generators are placed to be spatially overlapping each other forming a sensor-generator pair, thereby providing magnetic field cancellation that minimizes magnetic flux through said one or more magnetic field sensors.

According to some embodiments, the method may further comprise installing at least one additional magnetic field generator, positioned at a selected distance to be spatially separated from a respective sensor-generator pair, thereby enabling minimizing magnetic field at a position between spatial location of said sensor-generator pair and said additional magnetic field generator.

According to some embodiments, said processing sensing data comprises determining a magnetic field pattern within said selected region generated by one of or more external sources, determining a pattern of cancellation magnetic field, and operating said one or more magnetic field generators for generating said pattern of cancellation magnetic field.

According to some embodiments, at least one of said one or more magnetic field sensors and one or more magnetic field generators may provide a common magnetic field sensing and generating unit, the method comprises operating said at least one common magnetic field sensing and generating unit in time division duplex for sensing magnetic field flux therethrough in a first period of operation cycle, processing data on detected magnetic flux in a second period of operation cycle, and operating said one or more magnetic field generators for generating cancellation magnetic field in a third period of operation cycle.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 7 exemplifies sequential operation of sensing and generating cancellation magnetic field according to some embodiments of the present disclosure;

FIGS. 8A and 8B exemplify processing configurations of the control system according to some embodiments of the present disclosure. FIG. 8A exemplifies direct digital processing configuration, and FIG. 8B exemplifies processing arrangement configured for varying processing topologies;

FIGS. 9A and 9B exemplify respectively configurations of exposed and shielded magnetic field generators according to some embodiments of the present disclosure;

DETAILED DESCRIPTION OF EMBODIMENTS

Magnetic, and general electromagnetic fields are generated from various sources in electrical systems. Such sources may include transmission of electrical currents, accumulated charges etc. Variations in electromagnetic field and/or field orientation are generally considered as electromagnetic radiation, where frequency of field variations determines various characteristics thereof. Although low frequency electromagnetic radiation is generally non-ionizing, exposure to high intensity electromagnetic fields may cause damage to biological tissues and is considered hazardous.

Figure 1:
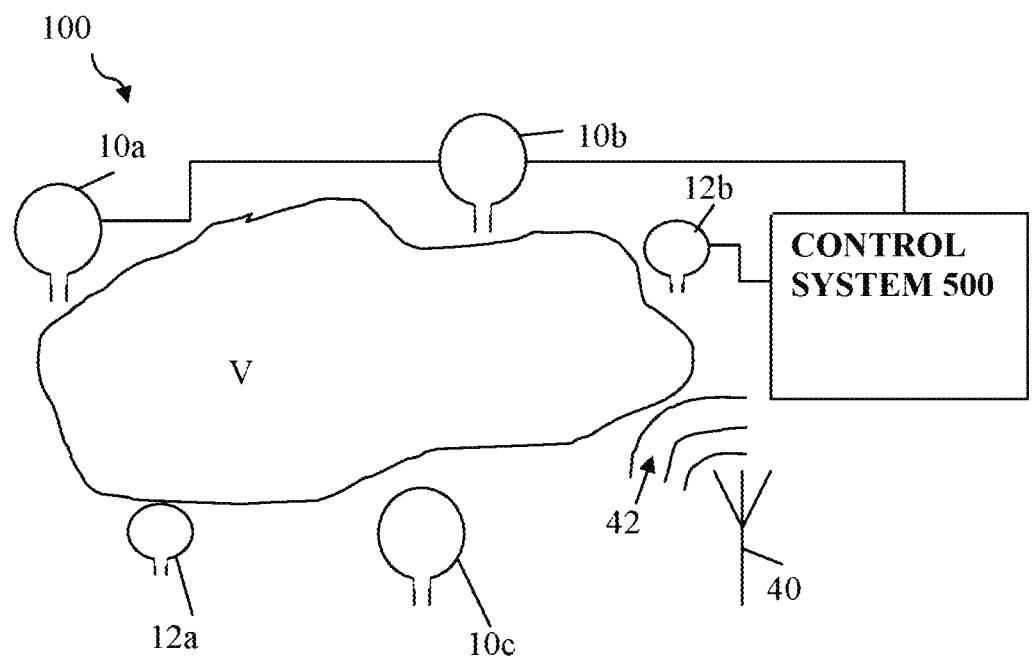
FIG. 1 schematically illustrates a system according to some embodiments of the present disclosure.

The present disclosure provides a system for active cancellation, or at least reduction, of relatively low frequency magnetic fields in a selected region. Reference is made to FIG. 1 schematically illustrating a system 100 according to some embodiments of the present technique. The system is configured for monitoring and actively cancelling, or at least reducing, magnetic fields in a selected region V. Typically, the magnetic field is generated by one or more sources (e.g., external sources including magnets, electricity carrying wires, etc.) and is generally not spatially uniform in the region. Further, as described herein below, the magnetic field may also vary in time. The system 100 includes one or more magnetic field generators, magnetic field generators 10*a*-10*c* are illustrated in FIG. 1, and one or more sensors configured for collecting data indicative of magnetic field in the selected region V, sensors 12*a* and 12*b* are illustrated in FIG. 1. Additionally, system 100 also includes a control system 500, connectable to sensors (generally at 12) for receiving sensing data indicative of magnetic field, and to the magnetic field generators (generally at 10) for operating the magnetic field generators to generate cancellation magnetic field. The sensors 12 may generally be magnetic field sensors configured for collecting data on magnetic flux through certain surface of the sensor, generally being an aperture defined by arrangement of coils in the sensor. Additionally, or alternatively, the one or more sensors 12 may include sensors connected to external magnetic field sources (e.g., electric motor, current inverter, electric current wires etc.). The sensor may be current sensor, e.g., utilizing galvanic connection to current carrying wires. Such sensor may provide sensing data indicative of operation of the magnetic field source, which can be converted using calibration data to data on magnetic field in the selected region V. For simplicity, the sensors are described herein as magnetic field sensors, but should be understood as various other sensors collecting data indicative of magnetic field.

Typically, magnetic field may be generated by one or more sources, exemplified in FIG. 1 by source 40 generating magnetic field 42. Generally, magnetic field is a vectorial field, meaning that addition of external field 42, and a generated cancellation field, generated by the one or more magnetic field generators 10, having generally similar magnitude by opposite direction, leads to zero field up to errors or small variations in magnitude or direction. It should be noted that magnetic field 42 (as illustrated schematically with propagating waves in FIG. 1) may include low frequency variation in magnetic field magnitude and/or direction, thereby requiring active and adaptive cancellation. Such active and adaptive cancellation may utilize feedback processing, feed-forward processing, or a combination of both.

Generally, magnetic field source 40 may include one or more known sources, such as one or more electrically operated elements of a vehicle. Operation of the present technique may be based on a calibration process in which magnetic field generated by the one or more sources 40 is measured in different operation modes thereof, to provide calibration data indicative of the magnetic fields to be canceled.

Generally, in some embodiments, the control unit 500 may include one or more input communication ports. The control unit 500 may be connected or connectable to communicate with one or more elements associated with external sources 40 of the magnetic field 42 to obtain operational data therefrom. Such operational data may indicate one or more parameters on magnetic field generated by the external source 40. For example, in electric vehicle using AC induction motor, the control system 500 may be connected to a vehicle control system (vehicle computer) to receive data on AC current frequency, indicative of frequency of magnetic fields generated by vehicle operation.

During operation of the system 100, the control system 500 may be operatively connected to the one or more magnetic field sensors 12, to receive sensing data on magnetic field detected by the sensors 12. Generally, such sensing data is indicative of a magnetic field flux passing through an effective surface/aperture defined by coil arrangement of the sensor. The one or more sensors 12 may include an arrangement of sensors 12 positioned for sensing magnetic field in a selected arrangement of locations and directions, enabling determining a general pattern of magnetic field in the region V. However, since the magnetic field sensors 12 may be positioned in various locations within or outside the selected region V, sensing data collected while the system is operated for generating a cancelation magnetic field is generally indicative of the cancellation magnetic field combined with external magnetic field. To this end, control system 500 may be operable for processing the sensing data and determining data on an external magnetic field, generated by one or more magnetic field sources that are other than magnetic field generators of the system (i.e., magnetic field generated by the system is not included for cancellation purpose) as described herein below. In some embodiments, a selected number of magnetic field sensors may be placed in one or more positions that are not affected by the cancelation magnetic field generated by the system, and only collect sensing data from external sources.

The control system 500 thus receives sensing data from the one or more magnetic field sensors 12, and processes the sensing data to determine data on magnetic field pattern in the region V. Utilizing the determined magnetic field pattern, the control unit operates to determine a cancellation field pattern, being generally an opposite pattern to magnetic field 42 in the region V, and operates the one or more magnetic field generators 10 for generating the cancellation field pattern, to thereby cancel, or at least significantly reduce magnetic field in the region V. In this connection it should be noted that the control unit 500 may be formed by analog electric circuits and/or include one or more processors and memory circuit. In embodiments using one or more processor and memory circuits, the processor may be adapted to execute suitable computer readable instructions typically pre-stored at the respective memory for processing input data and determining accordingly data on operative instructions for operating the one or more magnetic field generators 10.

Generally, as described in more detail further below, the control system 500 may be operable for processing the sensing data and data on operational signals transmitted to the one or more magnetic field generators 10, to thereby remove or eliminate effects of the cancelation magnetic field and determine the external magnetic field generated by sources external to the system. This may be achieved by subtracting data on cancelation magnetic field pattern from magnetic field pattern determined based on sensing data. Additionally, or alternatively, one or more of the sensors 12 may be positioned to provide sensing data indicative only of external magnetic field, i.e., shielded from, unaffected of negligibly affected by the magnetic field generators.

Figure 2:
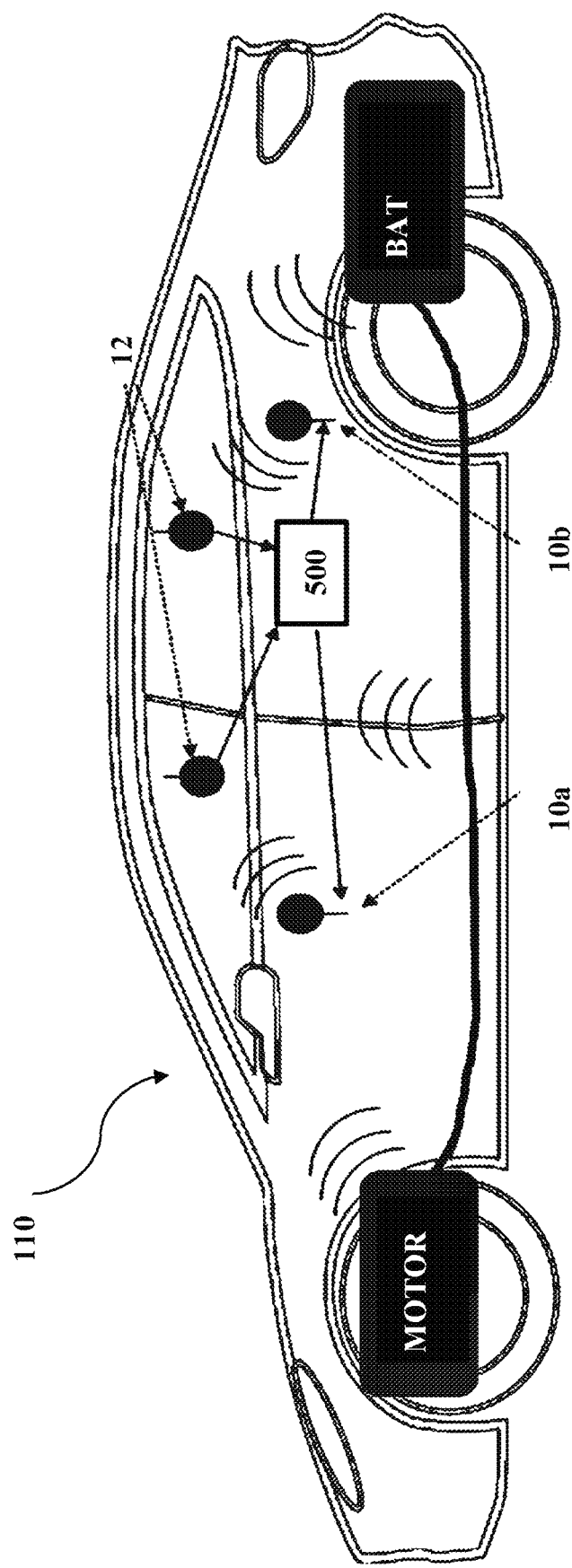
FIG. 2 exemplifies configuration of the system according to some embodiments of the present disclosure installed in a vehicle.

In this connection, reference is made to FIG. 2 exemplifying a vehicle 110, typically electric vehicle, hybrid electric vehicle, but internal combustion vehicles may also be used, in which the system of the present technique is installed to cancel, or at least reduce magnetic fields in passenger seating area of the vehicle 110. This is generally directed at reducing effects of exposure to high magnetic fields on passengers. As shown, and as described above, the system includes one or more magnetic field generators, 10*a* and 10*b*, one or more magnetic field sensors 12, and a control system 500.

Generally, control system 500 may include one or more processors and memory circuitry (PMC) operatively connected to input/output interface (generally hardware based I/O). The control system 500 may carry pre-stored data used for selected processing actions as described herein and is configured to execute functional modules in accordance with computer readable instructions, typically pre stored in the memory, provided by a computer readable medium or via input communication interface (e.g., via wired or wireless network communication). Additionally, or alternatively, the control system may include an analog processing circuitry. The analog processing circuitry may be designed in accordance with calibration data to generate operational instructions (i.e., input current patterns) directed to the one or more magnetic field generators 10 for generating cancellation magnetic field in response to sensing data indicative of magnetic field detected in the region, and at least partially generated by external sources. Generally, the control system 500, and/or I/O module thereof may include one or more multiplexers and a switching arrangement. The control system 500 may be configured to enable selectively switching ON and OFF selected different inputs from sensors and outputs to magnetic field generators.

The control system 500 may generally be programed by providing corresponding computer readable instructions to the one or more processors. Such updated computer readable instructions may be provided using one or more interfaces such as user interface, network communication interface and/or an input/output module.

In the present example of vehicle 110, magnetic fields may generally be generated by an electric motor configured to transfer energy from electrical current to mechanical torque that is further transmitted to wheels of the vehicle. Additional magnetic field sources may include current transmission lines carrying electrical current from power storage such as battery BAT, to power using elements such as the motor. To this end, the one or more magnetic field generators 10 may be positioned in selected regions around the passenger seats, within the seats themselves, within doors or general frame parts of the vehicle 110, to enable generating various magnetic field patterns in accordance with pre-provided data on magnetic field pattern within the vehicle.

Typically, system 100, and specifically memory and/or storage unit of the control system 500, may carry pre stored data associated with calibration of the magnetic field generators 10 thereof. Such calibration data may include data on arrangement of the magnetic field generators 10 around and within the selected region, type and configuration of each magnetic field generator, and response function thereof.

More specifically, the control system 500 may include pre stored calibration data indicative of magnetic field pattern generated by the magnetic field generators 10 in response to operation electric current provided to the magnetic field generators 10. For example, each of the magnetic field generators may be formed of a coil of electrically conductive material, having effective diameter D and a selected number of windings N. Typically various magnetic field generators may have different configurations in accordance with selected parameters such as magnetic field patterns and space requirements. The magnetic field generators 10 may be specifically designed in accordance with antenna inductance and the magnetic moment generated by the magnetic field generators. Each of the magnetic field generators thus is associated with a response function data, indicative of magnetic field pattern generated by the respective generator 10 in response to selected operation current transited therethrough. Further, such calibration data may include data on arrangement of the magnetic field generators, and magnetic field patterns formed in response to mutual operation of two or more magnetic field generators 10. This calibration data is generally used by the control system 500 in processing for determining operational data (e.g., electric current) transmitted to the different magnetic field generators 10 for generating a cancellation magnetic field. Additionally, such calibration data may be used for determining data on magnetic field generated by external source as described in more detail further below.

Additionally, or alternatively, the control system 500 may include pre stored external field calibration data indicative of one or more parameters of magnetic field patterns generated by the one or more external sources. In the specific and not-limiting example of vehicle 110, a preinstalling calibration may be performed, in which magnetic field patterns, generated by the vehicle's elements (motor, current carrying cables etc.) is characterized. Such magnetic field pattern characteristics are stored in the control system, to simplify processing of sensing data. Accordingly, using sensing data indicative of magnetic field measured by the one or more sensors 12, the control system may utilize the pre stored external field calibration data to determine pattern of magnetic field generated by the external source, and accordingly to determine a cancellation magnetic field pattern.

Generally, external magnetic field may vary in time. For example, typical electric vehicles operate using one or more induction motors, which typically operate by generating a rotating magnetic field within coils of a stator element to induce torque onto a rotor element for rotating the rotor. Frequency of rotation of the magnetic field determines a rotation speed of the motor. This is while the magnetic field generated by the stator may include field lines, of magnetic field, being effectively outside of the motor itself. Additional variations in magnetic field may be caused by variation of current transmitted between battery packs BAT and other electrical elements of the vehicle 110. For example, a specific source for magnetic field variation is associated with wiring connection between the battery to the DC/AC and AC/DC converters and to the motors.

To this end the present technique utilizes adaptive and active field cancellation. More specifically, the system according to the present technique may operate in cycles, where each cycle may include collection of sensing data, processing of the sensing data to determine one or more parameters of cancellation field and operating of the one or more magnetic field generators 10 to generate the cancellation magnetic field. Further, operations of sensing, processing, and generating cancellation magnetic field may be sequential or simultaneous in accordance with selected embodiments of the present technique as described in more detail further below.

Figure 3A:
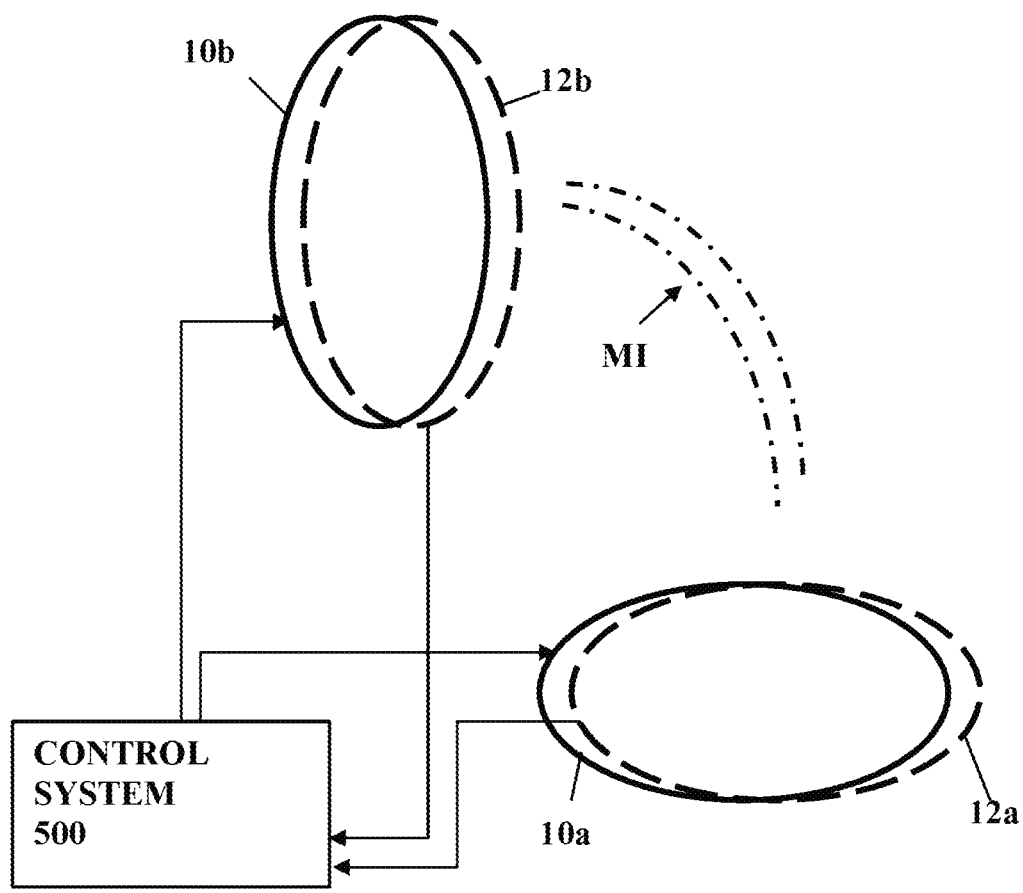
FIGS. 3A to 3C exemplify spatial arrangements of magnetic field generators and sensors for using feedback control, illustrating overlapping magnetic field generators and sensors (FIG. 3A), separated generator and sensors (FIG. 3B), and combination of overlapping and separated generators and sensors (FIG. 3C)
Figure 3B:
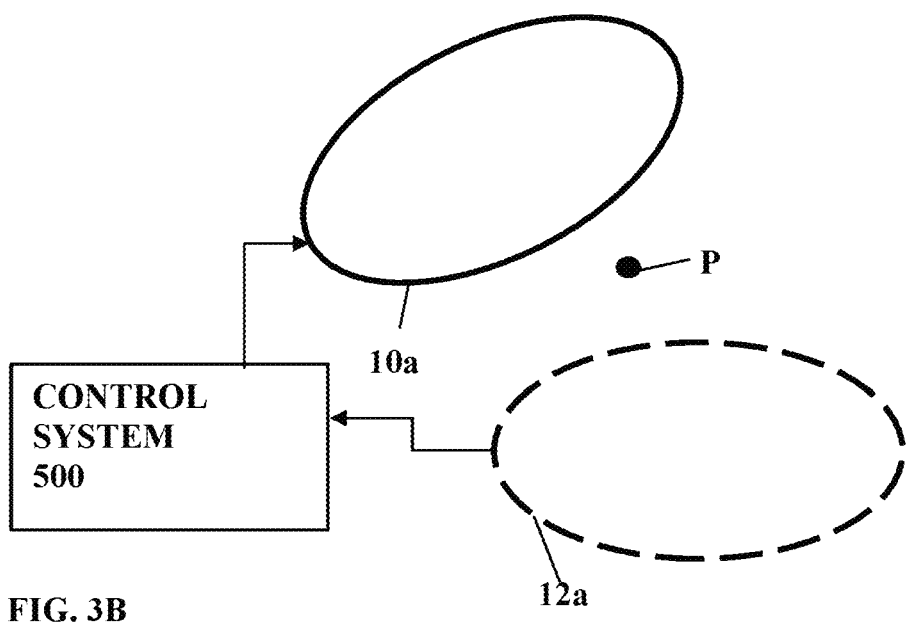
Figure 3C:
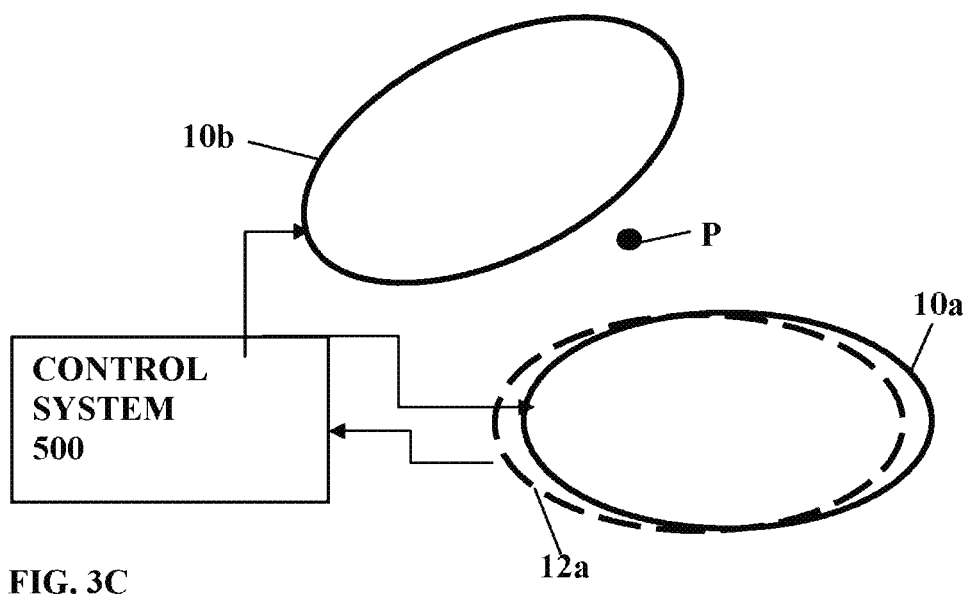

Reference is made to FIGS. 3A-3C illustrating arrangement magnetic field generators and sensors with selected spatial arrangement between them. FIG. 3A illustrates an arrangement of two magnetic field generators 10a and 10b and respective magnetic field sensors 12a and 12b connected to control system 500; FIG. 3B illustrates an arrangement of spatially separated magnetic field sensor and generators; and FIG. 3C illustrates an arrangement utilizing overlapping magnetic field sensor and generator, and additional magnetic field generator. As illustrated in FIG. 3A, the magnetic field sensors may be positioned to conform with the respective magnetic field sensors. This positioning may provide that magnetic flux that passes through a sensor 12a or 12b is generally equal to flux that passes through the respective generator 10a or 10b, therefore sensor directly measures variations in the magnetic field generated by the respective generator combined with the variations of the external magnetic field that passes through the area enclosed by the sensor. Although positioning of the magnetic field generators 10a and 10b and magnetic field sensors 12a and 12b is selected to provide overlap between magnetic field generator and a respective magnetic field sensor, certain mutual induction MI typically affects the sensing data.

The control system 500 may be operable as feedback control for utilizing input sensing data from the magnetic field sensors 12a and 12b, to determine output operational instructions, typically in the form of electric current, for generating suitable cancellation magnetic field by magnetic field generators 10a and 10b. In this connection, operation of the feedback control by the control system 500 may determine output electrical current to be transmitted to the magnetic field generators 10a and 10b (or additional magnetic field generators) in accordance with sensing data collected by the magnetic field sensors 12a and 12b (and additional sensors when used). Determining required cancellation magnetic field utilizes processing (using digital or analog processing arrangement) of the sensing data and operating magnetic field generator to emit cancellation magnetic field to minimize the sensed magnetic field. Generally, the sensing data relates to magnetic flux through the sensor, where the magnetic field flux includes a first portion of magnetic field Hev generated by one or more external sources, being magnetic field to be canceled, and a second portion of the sensed magnetic field Htx, associated with cancellation magnetic field generated by the one or more magnetic field generators.

The second portion of the sensed, magnetic field Htx includes magnetic field generated by one or more magnetic field generators. For example, sensing data provided by sensor 12a includes magnetic field generated by magnetic field generator 10a that spatially overlaps with sensor 12a, as well as a portion of magnetic field generated by generator 10b. Mutual induction MI between magnetic field generator 12a and sensor 12b, or between generator 10b and sensor 12a as well as between the generators 10a and 10b generated cross talk between the respective magnetic field generators. In some embodiments, the present technique may utilize pre-stored data on the mutual induction MI providing a measure to the ratio of magnetic field generated by non-overlapping magnetic field generators (e.g., 10b) within the sensed cancellation magnetic field. Generally, in some embodiments, the control system may operate globally as discussed below with respect to coupling parameter regarding table 1. Accordingly, the control system 500 may operate to optimize cancellation of external magnetic field Hev, typically by minimizing sensing data using operational data on magnetic field generated by the one or more magnetic field generators, such as 10a and 10b, while accounting for mutual inductance MI between the magnetic field generators and magnetic field sensors, being known or unknown parameter.

As generally indicated above, the one or more magnetic field sensors may be formed of a wired coil or loop of electrically conducting wire, where sensing data may be in the form of electric potential difference along the wire of the sensor. This is associated with induction of electric field along the sensor due to changes in magnetic field flux through the sensor. The sensor may be connected to an electrical current meter (or voltage meter) providing sensing data to the control system 500, or directly connected to the control system, where voltage between the connections to the sensor may be determined by voltage meter included in the control system. Accordingly, the voltage generated along the sensor coil by variation in magnetic field is determined by:

$$V = K \frac{dH}{dt}$$

where V is the voltage along the sensor coil, K is a sensor parameter, associated with coil area, H is the magnetic field where $H=B/\mu_0$. More specifically, the voltage induced along the sensor is proportional to time variation of magnetic field flux through the sensor. The control system 500 may thus include an integration module, being software or hardware module, configured for integrating voltage measured on the different sensors to determine magnetic field in the region. Generally, magnetic field may be determined as:

$$H = 1/K \int V dt$$

Such integration may be performed digitally or by analog circuit. The digital integration may be performed by recursive equation such as $y(i)=\alpha y(i-1)+x(i)$. Where y is indicative of integration data, being associated with magnetic field, and x relates to the measured sensing data. The parameter $\alpha$ is generally selected to be $\alpha<1$, provided to improve stability of the integration, while being very close to unity. It should be noted that for a perfect integrator, the parameter $\alpha$ equals 1.

In some other configurations, an analog integration module may be formed using a resistor, having resistance R1, along electric wire of the sensor coil having inductance L1. In terms of Laplace transform, the voltage along the sensor satisfies:

$$\frac{Y(s)}{V(s)} = \frac{R1}{R1 + L1 \cdot s}$$

This provides sensing signal y, being inverse Laplace transform of Y(s).

Accordingly, digital and/or analog processing techniques provide signal y proportional to the magnetic field H, with certain proportionality parameter $K_1$, such that $y=K_1 H$. Generally, the proportionality parameter may be pre-calibrated and stored in storage unit of the control system.

The control system 500 may utilize the sensing data and signal data y indicative of magnetic field sensed by the sensor 12, to determine output operational instructions for one or more magnetic field generators. As indicated above, the control system 500 may utilizes various feedback techniques for determining the output operational instructions (typically in the form of electrical current) provided to the magnetic field generators 10 for generating cancellation magnetic field. Generally, determining output electrical current may include determining a portion of electrical current induced along the magnetic field generators by variation of magnetic field, being external magnetic field Hev and/or magnetic field generated by one or more other magnetic field generators.

In some examples, the control system may be operated for feedback processing utilizing a multiplication by feedback gain $K_{FB}$ and an additional integration. For example, determining a feedback $z=K_{FB} \cdot y$. Integration of the feedback parameter may be performed digitally, or by analog integration, e.g., using Laplace transformation providing:

$$\frac{I_{FB}(s)}{z(s)} = \frac{1}{R2 + L2 \cdot s}$$

where $I_{FB}$ is the electrical current to be transmitted to the magnetic field generator, R2 is resistance of the magnetic field generator, L2 is inductance of the magnetic field generator and s is the Laplace parameter.

In addition to the feedback current, variation in external magnetic field and in magnetic field generated by one or more other magnetic field generators may induce current through each magnetic field generator. Thus, the actual electric current through a magnetic field generator may be $I_{TX}=I_{FB}+I_{TX\_EV}$, where $I_{TX\_EV}$ is the electrical current induced through the magnetic field generator due to variations in magnetic field flux therethrough. Accordingly, magnetic induction and induced current through the one or more magnetic field generators may provide for certain natural cancellation of the magnetic field due to induced current $I_{TX\_EV}$. Additionally, the control system according to the present disclosure provides for additional active cancellation by transmitting additional electric current $I_{FB}$ by applying voltage on the magnetic field generator using feedback circuit. This provides that the cancellation magnetic field $H_{TX}=K_{TX} \cdot I_{TX}$, where $K_{TX}$ is a generator parameter associated with dimensions of the magnetic field generator.

Accordingly, the above analysis provides an open loop transfer function G that may be written as:

$$G = \frac{H_{TX}}{H_{Res}} = \frac{K_1 K_{FB} K_{TX}}{(R_2 + L_2 s)}$$

where $H_{Res}=H_{EV}-H_{TX}$ is residual magnetic field, and the parameters $K_1$ and $K_{TX}$ as defined above are generally constant that may be pre-stored in the control system 500. This provides the closed loop transfer function by:

$$\frac{H_{Res}}{H_{EV}} = \frac{1}{1+G} = \frac{(R_2 + L_2 s)}{((R_2 + K_1 K_{FB} K_{TX}) + L_2 s)}$$

The residual magnetic field $H_{Res}$ is effectively the magnetic field due to combination of external field and cancellation field. Accordingly, as the ratio ($H_{Res}/H_{EV}$) is smaller, the cancellation efficiency is better, and thus the system's performance. Generally, performance of the cancellation system may be selected in accordance with selection or tunning of the feedback gain $K_{FB}$. Selection of feedback gain $K_{FB}$ may also be associated with maintaining stability of the feedback control system. The feedback gain parameter may also be selected with respect to temporal spectrum (frequency range) of the external magnetic field to be canceled.

The transfer function above is written in Laplace domain. Frequency response of the closed loop is given by substituting $s=i2\pi f$, where f is frequency in Hz and $i^2=-1$ is the imaginary unit. As shown from the transfer function, cancellation ratio of magnetic field is generally frequency dependent. Operation of various electrical systems may be characterized by certain frequency range, and selection of feedback gain value may be based on pre-provided data on typical frequencies of magnetic fields generated by a respective source that is to be canceled.

Generally, the control system 500 may include one or more feedback controllers associated with the one or more magnetic field generators used. Separation between feedback control of the magnetic field generators may be sufficient for magnetic field generators that are arranged about orthogonal axes (e.g., X, Y and Z). More specifically, the feedback control described herein above operates to cancel magnetic field flux through the magnetic field generator (typically using overlapping magnetic field sensor), such that magnetic field in a region between a selected arrangement of two or more magnetic field generators, and preferably three magnetic field generators to span a three-dimensional space, is generally canceled. This configuration and control operation provides cancellation magnetic field, using limited calibrations, where the required pre-calibrated parameters relate to physical and spatial arrangement of the magnetic field generators and sensors. Furthermore, the present technique as described herein provides feedback control that maintains magnetic field cancellation based on magnetic flux though the one or more sensors, thus, variations in surroundings and in the magnetic field are handled by the control feedback technique. Therefore, the present technique may be operated in stationary and/or mobile platform, such as vehicles, and specifically electric and/or hybrid electric vehicles. It should however be noted that various other feedback control techniques may be used according to the present disclosure.

The feedback control technique is described as relating to system configuration that utilizes spatial overlap between magnetic field sensors 12 and respective magnetic field generators 10 as illustrated in FIG. 3A. However, such control feedback technique may also be used for other spatial arrangement of the magnetic field generators and sensors. In this connection FIG. 3B illustrates a system configuration using spatially separated sensor 12a and generator 10a operated by a control system 500. This configuration is an exemplary configuration, and typical magnetic field cancellation system may utilize one or more, and typically two or more magnetic field generators and magnetic field sensors arranged for cancelling magnetic field in a selected region.

In system arrangement where magnetic field generator 10a is placed at a slightly different location than a respective magnetic field sensor, the feedback control may generally be operated to minimize magnetic field in a selected location P. this may be achieved by placement of the magnetic field generator and magnetic field sensor such that the selected location P is between them and operating the system to minimize the receive sensing current from the magnetic field sensor 12a. This is generally associated with minimizing total magnetic field flux through sensor 12a. Generally, placement of the magnetic field generator 10a separated from a respective sensor 12a may increase complexity in determining cancellation magnetic field to cancel the field flux through the magnetic field sensor 12a. However, the present technique is generally directed at minimizing magnetic field at a selected region, such as passenger compartment of a vehicle. The control feedback may generally be similar to the above-described feedback processing, while separation of the magnetic field sensor 12a and respective magnetic field generator 10a provides for extending shape and region of field cancellation.

An additional arrangement of the magnetic field generators and sensors is illustrated in FIG. 3C. In this configuration, the two magnetic field generators 10a and 10b are illustrated, associated with a single magnetic field sensor 12a, placed around a selected position P. The two magnetic field generators 10a and 10b in this example are arranged around a common point, with a selected angular relation between them, and associated with a common magnetic field sensor 12a. One of the magnetic field generators 10a is positioned to be spatially overlapping with the magnetic field sensor 12a, while the other magnetic field generator 10b is placed at a selected distance therefrom, having selected position P between them. The magnetic field sensor 12a is configured to provide sensing data to the control system 500, to thereby enable feedback control providing selected electrical current to the magnetic field generators 10a and 10b for cancelling, or at least significantly reducing magnetic field at the selected location P. This configuration provides a set of two or more magnetic field generators associated with a magnetic field sensor positioned to spatially overlap with one of the magnetic field generators.

Figure 4:
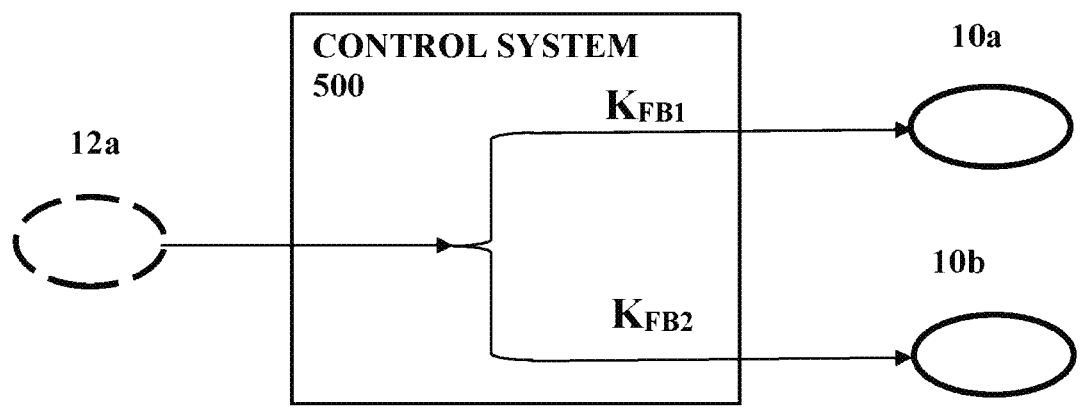
FIG. 4 illustrates a control feedback operation for the system arrangement in FIG. 3C.

Reference is made to FIG. 4 exemplifying control feedback operation for system arrangement as illustrated in FIG. 3C. In this arrangement, the control system 500 may include an integrator module configured to receive input signals indicative of variations in magnetic field flux through the sensor 12a, and feedback control module operating for determining output current provided to the magnetic field generators 10a and 10b as described above. The feedback control module may generally utilize feedback gain parameters $K_{FB1}$ and $K_{FB2}$ for each of the magnetic field generators 10a and 10b, which may be different or similar.

As generally described above, the present technique is directed at cancelling, or at least significantly reducing magnetic field at a selected region. Such selected region is generally suitable for presence of people such as passenger compartment of a vehicle. Accordingly, the present technique is directed at minimizing magnetic field at a selected location generally offset from the center of the magnetic field sensor 12a. to this end, proper selection of feedback gain parameters $K_{FB1}$ and $K_{FB2}$ enables tunning of cancellation effect.

Generally, a relation between the feedback gain parameters $K_{FB1}$ and $K_{FB2}$ may determine spatial location of the selected region for cancellation of magnetic field. For example, setting $K_{FB2}$ to be zero, reduces the system arrangement to be generally similar to the arrangement of FIG. 3A having spatially overlapping magnetic field generator and sensor. In this configuration, a single set of magnetic field generator and sensor provides cancellation magnetic field flux through the sensor 12a coil. An increase of feedback gain parameters $K_{FB2}$ provides for shifting the region most affected by cancellation magnetic field toward magnetic field generator 10b. Accordingly, adjustment of the relative values of parameters $K_{FB1}$ and $K_{FB2}$ provides for tunning of the cancellation region P to meet the requirements of the application. For example, to coincide with passenger sitting region in a vehicle.

Accordingly, arrangement of two or more magnetic field generators associated with a magnetic field sensor enables the present technique to tune the location where magnetic field is minimized. This further enables the technique to extend and shape the magnetic field cancellation area using adjustable parameters. It should be noted that, although the feedback control and arrangement of the magnetic field generators and sensor is illustrated in FIGS. 3A to 3C using one or more magnetic field sensors, the present technique may generally utilize increased number of magnetic field sensors and generators for extending area of magnetic field cancellation region and improve efficiency of the system. Further, arrangement of selected number of magnetic field sensors, aligned along selected different axis, enables to take into account vectorial nature of the magnetic field, and to provide cancellation field along different axes.

Figure 5:
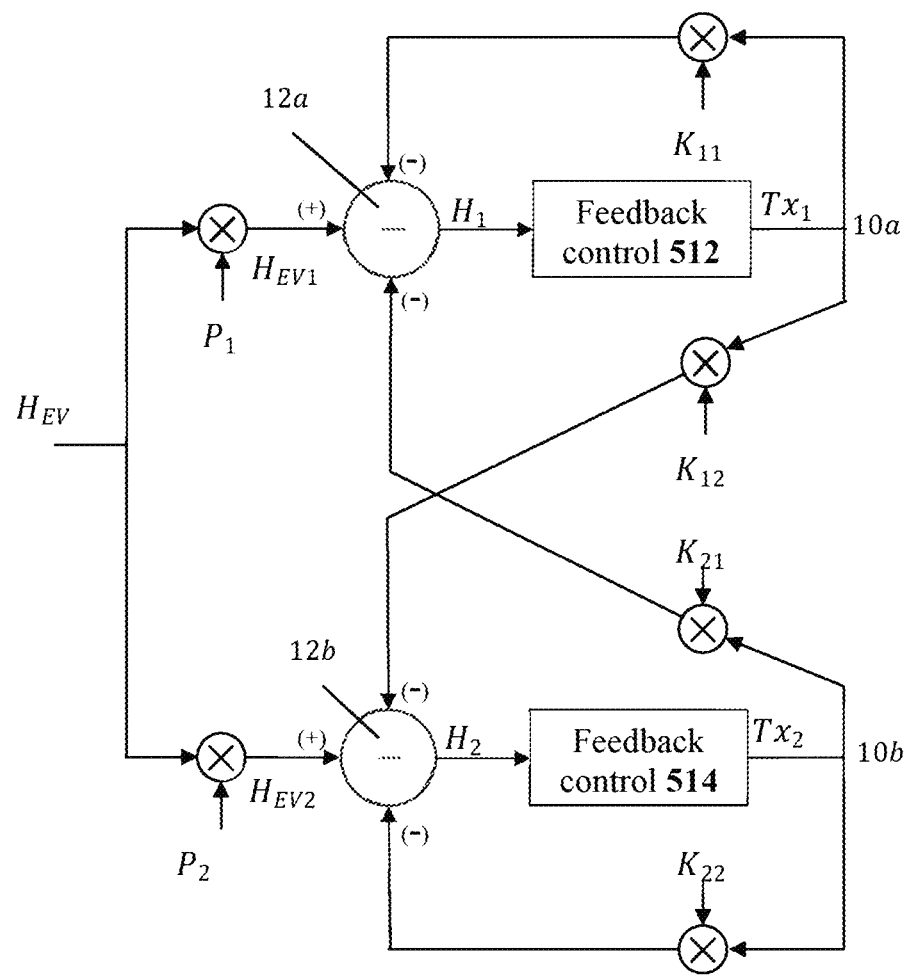
FIG. 5 exemplifies feedback control schematics for operation using two magnetic field sensors and two magnetic field generators.

An arrangement of two or more magnetic field sensors and respecting number of two or more magnetic field generators typically causes certain interference and mixing between the sensing data and cancellation magnetic field. FIG. 5 illustrates feedback control schematics for operation using two magnetic field sensors 12a and 12b and respective two magnetic field generators 10a and 10b.

As illustrated in FIG. 5, each one of the magnetic field sensors 12a and 12b detected an external magnetic field $H_{EV}$ with respective proportionality parameters $P_1$ and $P_2$. The proportionality parameters indicate the different location and orientation of the magnetic field sensors with respect to external magnetic field $H_{EV}$. The collected sensing data $H_1$ and $H_2$ is integrated as indicated above, and processed by feedback control modules 512 and 514, both being associated with the control system 500 described above. Output data providing electrical current Tx1 and Tx2 to magnetic field generators 10a and 10b causes generation of cancellation magnetic field, which is also detected by magnetic field sensors 12a and 12b with respective coupling ratios.

The magnetic field generated by generators 10a and 10b is detected by the sensors with respective self-coupling parameters $K_{11}$ and $K_{22}$, and respective cross-coupling parameters $K_{21}$ and $K_{12}$. The coupling parameters depend on spatial arrangement of the magnetic field sensors and generators. For example, for the simple arrangement where magnetic field sensor and a respective generator are spatially overlapping, the respective coupling parameter may be one or very close to unity. Distance between magnetic field generator and magnetic field sensor generally reduces the coupling parameter, and similarly is variation of orientation. Generally, the coupling parameters ranges between positive and negative one, i.e., $-1 \leq K_{ij} \leq 1$.

Feedback control of this system may be modelled using a set of relation equations represented by:

$$\begin{bmatrix} H_1 \\ H_2 \end{bmatrix} = \begin{bmatrix} P_1 \\ P_2 \end{bmatrix} H_{EV} - \begin{bmatrix} K_{11} & K_{12} \\ K_{21} & K_{22} \end{bmatrix} \begin{bmatrix} Tx_1 \\ Tx_2 \end{bmatrix}$$

The inventors of the present technique conducted several simulations for different parameter settings, indicating efficiency of magnetic field cancellation technique. Simulated coupling parameters and simulation results are shown in Table 1 below. The simulation data utilizes magnetic field signal associated with operation of a hybrid electric vehicle and relate to magnetic field frequencies typical to vehicle operation.

In the simulation results, the RMS ratio relates to a ratio between RMS magnetic field values with and without cancellation field. Accordingly, greater RMS ratio indicates improved field cancellation. Simulation number 1 is conducted without any coupling, and therefore operates similarly to the technique described above with respect to FIG. 3A. This simulation may be used as a reference for determining feedback gain $K_{FB}$ as described above. Additionally, or alternatively, the feedback gain $K_{FB}$ is determined iteratively starting from a selected feedback gain value and adjusting it to minimize the resulting magnetic field. Generally, in some embodiments, the feedback gain $K_{FB}$ may be pre-selected based on initial setting of the system. In some other configurations, the technique may be configured to iteratively determine feedback gain value by selection of a setting mode. This may be done manually or periodically to optimize system operation.

The simulated results indicate that positive cross-coupling (Simulation No. 2) provides better results than negative cross-coupling (Simulation No. 3). Generally positive cross-coupling is associated with direction and orientation of the magnetic field sensors and generators in the system. Positive cross-coupling indicates that cancellation magnetic field generated by one generator, also assists in cancelling the magnetic field measured by other magnetic field sensors 12a and 12b. This is while negative cross-coupling indicates that cancellation field generated by generator 10a causes an increase in magnetic field measured by sensor 12b. This is further illustrated in simulations No. 3 and 4 showing increasing negative coupling parameters. Simulation No. 5 shows a generally non-realistic situation where the negative cross-coupling effect is similar in magnitude as the self-cancelling effect.

The simulation results shown in Table 1 indicate that proper arrangement of the magnetic field sensors and generators to provide non-negative cross-coupling between them provides for generally more efficient operation of the present technique. Generally, however, control system 500 may be operable for monitoring feedback parameters to avoid an unstable feedback loop that may increase magnetic field and/or increase power used by the system. Generally, control system 500 may be configured to restart with reset parameters in response to detection of rapid increase in magnetic field signal, current consumption, or other operational parameters. Such system reset may generally include reducing feedback parameter $K_{FB}$.

Figure 6:
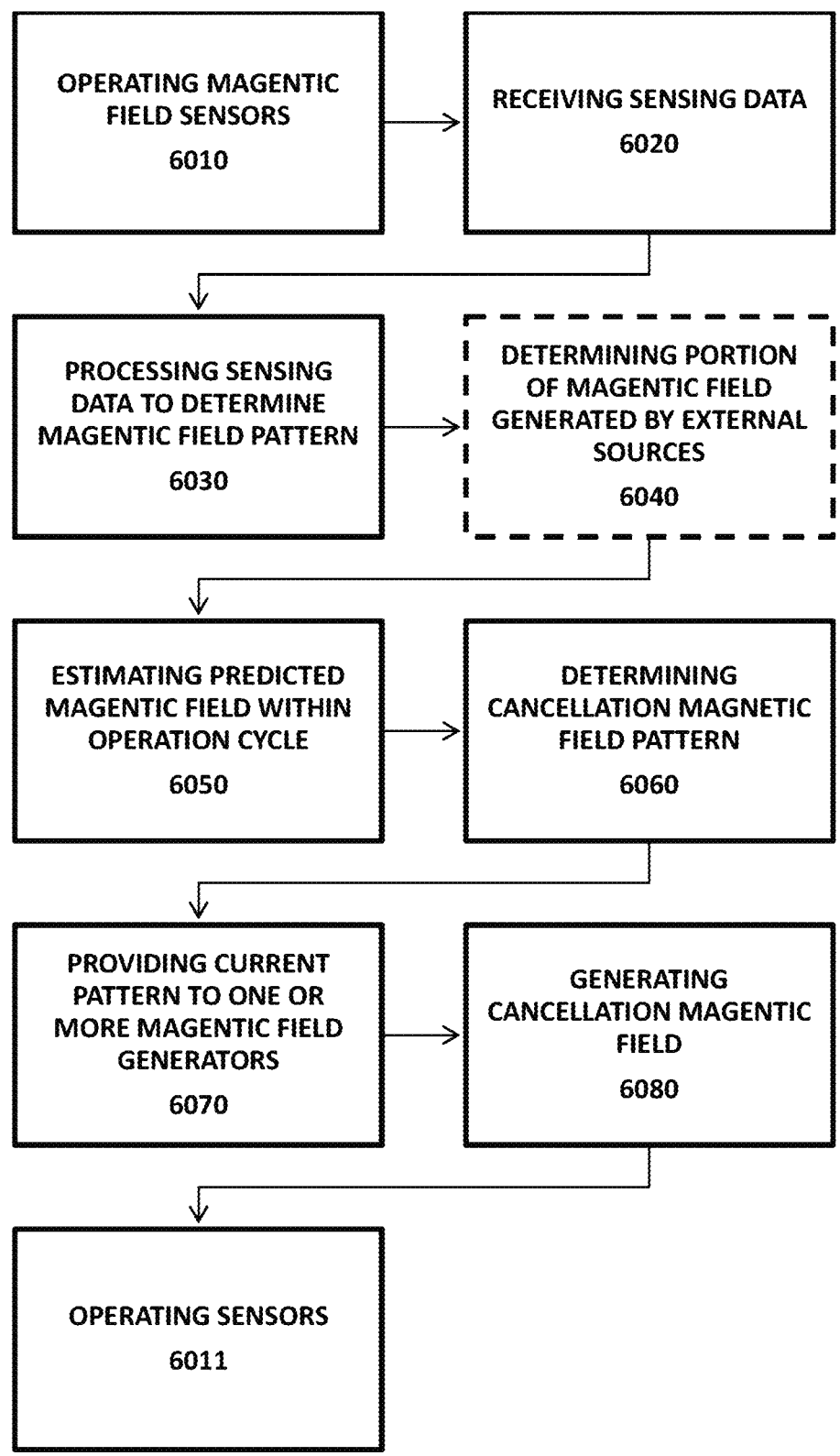
FIG. 6 exemplifies operation of the technique according to some embodiments of the present disclosure in a way of a block diagram.

Such feedback control is generally suitable for simultaneous operation of magnetic field generators and sensors. As indicated above, the present technique may also be operable using time sequencing of operation between sensing and generating magnetic field in selected operation cycles. In this connection, reference is made to FIG. 6 exemplifying

TABLE 1

| Sim No. | $P_1$ | $P_2$ | $K_{1,1}$ | $K_{2,2}$ | $K_{1,2}$ | $K_{2,1}$ | RMS Ratio 1 | RMS Ratio 2 | Comments |
|---|---|---|---|---|---|---|---|---|---|
| 1 | 1.0 | 1.0 | 1.0 | 1.0 | 0.0 | 0.0 | 21 | 21 | No coupling |
| 2 | 1.0 | 0.7 | 0.9 | 0.9 | 0.2 | 0.3 | 23 | 26 | Positive coupling increases cancellation |
| 3 | 1.0 | 0.7 | 0.9 | 0.9 | −0.2 | −0.3 | 15 | 14 | Negative coupling decreases cancellation |
| 4 | 1.0 | 0.7 | 0.9 | 0.9 | −0.7 | −0.6 | 7 | 5 | More negative, larger decrease |
| 5 | 1.0 | 1.0 | 0.9 | 0.9 | −0.9 | −0.9 | 1 | 1 | Coupling same but opposite - No cancellation | operation of the system according to some embodiments of the present technique. As shown, the system operates the one or more magnetic field sensors 6010, and receives sensing data 6020 indicative of magnetic field detected by the sensors. As indicated above, certain magnetic field sensors may also be operable as magnetic field generators (combined sensor generator) while other magnetic field sensors may be only operated for collection of sensing data. The control system generally operates for processing the sensing data 6030 to determine one or more parameters of sensed magnetic field. The processing generally includes utilizing pre-stored data on arrangement of the magnetic field sensors. More specifically, a magnetic field sensor may generally be configured to generate output signal indicative of certain projection of magnetic field vector at position of the sensor, or magnetic flux through a surface defined by the sensor structure. To this end, the processing may utilize data on arrangement in terms of position and direction of orientation of the magnetic field sensors, to determine a vectorial representation of magnetic field within the region.

Additionally, in some embodiments, where magnetic field sensing and generation of cancellation field occur simultaneously, the processing may operate for determining a portion of magnetic field generated by external sources, which are not included in the one or more magnetic field generators. In this case, the technique may include processing parameters of the sensed magnetic field to determine a portion of magnetic field generated by external sources 6040. This processing action may utilize processing of output operation signals transmitted to the one or more magnetic field generators, and pre-stored data on response function of the magnetic field generators, i.e., data on parameters of magnetic field generated by the magnetic field generators in response to input current, determined by the operational signals provided by the control system. Such pre-stored data may include data on locations and orientation of the one or more magnetic field generators 10, data on response function indicative of magnetic field strength and pattern of relative directions generated in response to input current (typically associated with coil structure, number of windings and effective diameter), and current profile transmitted to the magnetic field generators. In some other embodiments, as indicated above, the system of the present disclosure may operate for minimizing sensed magnetic field utilizing feedback control techniques as described above.

Using the determined magnetic field, the technique may utilize pre stored calibration data for computing and determining estimation of magnetic field variation within at least one operation cycle 6050. This enables generating cancelation magnetic field based on predicted magnetic field generated by external sources and anticipating variations in magnetic field to overcome delays associated with processing times.

In embodiments where sensing and generating of magnetic field are sequential, determining parameters of magnetic field based on the sensing data typically corresponds with determining magnetic field generated by external sources.

Using the data on magnetic field, generated by sources external to the system, i.e., not including magnetic field generated by the one or more magnetic field generators, the present technique operates to determine a cancellation magnetic field pattern 6060. The cancellation magnetic field pattern is generally determined as magnetic field that is generally similar in magnitude and opposite in direction to the magnetic field determined in the selected region V. To limit interference with normal operation of external systems, such the electric motor of a vehicle in which the system is installed, the cancellation magnetic field may be determined within the boundaries of the selected region V. Such cancellation magnetic field may be an estimation, determined in accordance with data on properties of magnetic field pattern that can be generated by the installed arrangement of the magnetic field generators, under a computational constraint that the total magnetic field is reduced.

Accordingly, the cancelation magnetic field pattern may be time dependent. More specifically, processing of the sensing data and determining pattern of magnetic field to be canceled, may further include utilizing estimated variation of magnetic field determined in 6050 and/or pre stored data on time-variation of magnetic field generated by the external sources, and determining prediction of magnetic field variation. The cancelation magnetic field is typically determined for canceling predicted magnetic field due to possible time variation between sensing and transmitting/generating magnetic fields, associated with data transmission and processing time.

Upon determining parameters of the cancellation magnetic field, operational signals indicative of currents transmitted to the one or more magnetic field generators 10 are updated 6070. The cancellation magnetic field is generated 6080 by transmitting operational signals to the one or more magnetic field generators, thereby causing transmission of electric currents therein, in accordance with pattern of the cancellation magnetic field. In accordance with operation cycles of the technique, the one or more magnetic field sensors are operated again 6011, to obtain sensing data and adjust operation of the system in cancelling magnetic field in the selected region.

In this connection, the operation cycles may vary in accordance with different embodiments of the present technique. As indicated above, one or more of the magnetic field generators may also be operable as magnetic field sensors. An exemplary operation cycle is illustrated in FIG. 7. FIG. 7 exemplifies an operation cycle formed by three main actions, a first period of the operation cycle is directed at sampling magnetic field by collection of sensing data from the one or more magnetic field sensors. A second period of the cycle is directed at processing the sensing data and determining cancellation magnetic field. At the third period of the cycle, the technique utilizes operation of the magnetic field generators for generating the cancellation magnetic field. The present technique may utilize time division multiplexing of magnetic field sensors/generators in such exemplary cycle, where one or more magnetic field generators are also operable as magnetic field sensors during sample period, and operable as magnetic field generators during cancelation period. Further, in some configurations, one or more magnetic field sensors may be operable for collecting sensing data during cancelation period to provide efficiency feedback indicating This operation cycle relates to embodiments where all at least some of the magnetic field generators are operable as magnetic field sensors. Certain variations may be associated with embodiments where some of the magnetic field generators are operable as magnetic field sensors, or when the groups of magnetic field generators and sensors are partially overlapping. More specifically, during sample period, one or more magnetic field generators may be operated based on cancellation magnetic field determined in a previous period, while the magnetic field sensors are operated for collecting updated sensing data. Similarly, magnetic field sensors may be operated for collecting additional sensing data during cancelation period, when the majority of magnetic field generators are operated for generating the cancelation magnetic field.

Further, in some configurations of the system, at least one magnetic field sensor may be operated for sensing magnetic field at same time as one or more magnetic field generators are operated for generating cancelation magnetic field. This may be used either when magnetic sensing and cancelation operations are sequential or when sensing and cancelation are simultaneous. Generally, providing additional sensing data at the same time with generation of cancelation magnetic field may be indicative of efficiency of the cancelation field.

Generally, when operating in sequential operation cycle as exemplified in FIG. 7, cancelation magnetic field generation during sample and processing periods is at least not complete. More specifically, during these periods either no cancelation magnetic field is generated, or cancelation magnetic field is generated by some of the magnetic field generators. This means that the external magnetic field cannot be fully canceled, however it may be reduced. Further the accumulated effect of magnetic field is reduced throughout time formed by a few operation cycles, which generally achieves the purpose of the present technique.

Also, as described above, the processing may utilize pre-stored data on time varying pattern of external magnetic field. Such pre-stored data may be collected using pre-installation calibration process and relate to variation of the magnetic field pattern generated by the external sources (e.g., vehicle motor and transmission cables). Operating in sufficiently short operation cycles, e.g., in the range of a few microseconds, such variations of the external magnetic field can be considered, to determine corresponding variations in cancelation magnetic field and operating the one or more magnetic field generators accordingly.

Figure 8B:
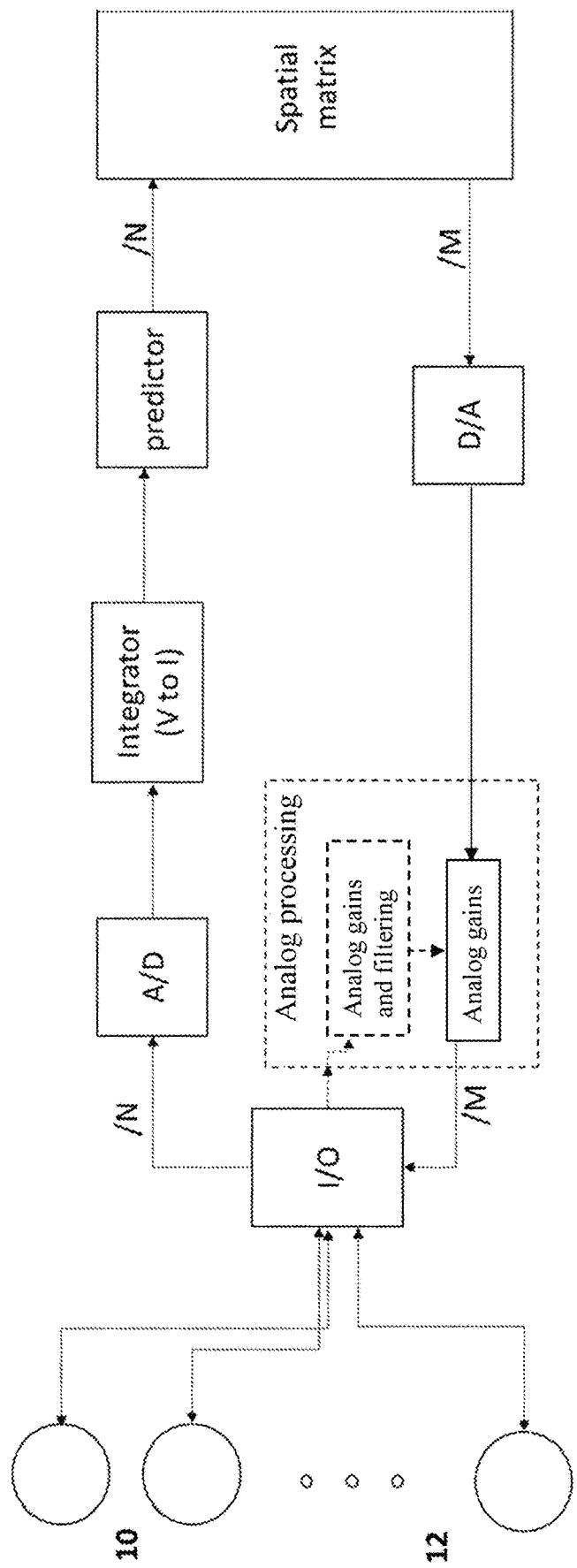

FIGS. 8A and 8B exemplify processing configuration of the control system according to some embodiments of the present technique. In FIG. 8A, sensing data is collected by input/output module I/O of the control system. The sensing data may be converted using an analog to digital A/D converter to digital data indicative of a plurality of one or more arrangement of sensing input channels. Alternatively, the data may be directed to analog processing. Generally different channels of the digital sensing data are indicative of magnetic field portions detected by respective magnetic field sensors. The sensing data is used by a predictor module for determining corresponding magnetic field pattern, and possibly determining predicted magnetic field pattern for a selected period (e.g., a few microseconds). The technique further processed the predicted magnetic field patterns by phase inversion to determine pattern of cancellation magnetic field. The cancellation magnetic field pattern is split by spatial matrix module to determine data on specific operation of the different magnetic field generators, indicating the field portions to be generated by each of the magnetic field generator to collectively generate the cancelation magnetic field in the selected region. The spatial matrix portions are further converted to analog operational signals and transmitted via I/O module to the magnetic field generators. Generally, the operational signals are indicative of electrical current to be provided to the magnetic field generators, and respective polarity for generating desired portion of cancelation magnetic field.

As shown in FIG. 8B, the processing configuration may operate in one or more operation modes. In this configuration, the phase inversion operation may be performed by the spatial matrix defining output operational signal to be directed to each specific magnetic field generator, and/or by analog circuit providing analog gains to the magnetic field generators 10. This configuration generally enables different techniques for obtaining sensing data indicative of magnetic field generated by one or more external sources. In a first mode, the one or more magnetic field sensors 12 provide sensing data to be digitized by A/D module. In a second mode, the sensing data is directed for analog processing by determining analog gains and filtering. Such analog processing may utilize direct switching of the analog gains module determining gain of output operational signals transmitted to the one or more magnetic field generators 10. Further, as indicated above, the one or more magnetic field sensors may be configured to collect sensing data on current transmitted through one or more conductors (e.g., using galvanic connection). Similarly, to sensing data on magnetic fields, such sensing data may be directed for digital or analog processing paths.

Generally, the input/output module I/O may include communication ports, multiplexer, one or more switches, and may further be associated with amplification and filtering circuitry. Additional analog filtering and amplifying circuits may be used within the control system, operating on either analog or digital signals.

Examples of magnetic field generators are schematically illustrated in FIGS. 9A and 9B, the magnetic field generator of FIG. 9A is formed of electrically conductive coil having effective diameter D and a selected number of N windings. The magnetic field generator is configured to receive input current via input cable that may be configured by twisted pair wiring to minimize magnetic field leakage. Alternatively, the input current may be directed via coaxial cables or any other cable configurations selected to minimize leakage of magnetic fields. FIG. 9B exemplifies a generally similar magnetic field generator, including high permeability coating, typically made of high permeability metal. The coating is selected to reduce near field effects of the magnetic field generated by the magnetic field generator, while maintain the desired field at the target area, typically at least a portion of the selection region V. As indicated above, geometrical shape of the one or more magnetic field generators may vary in accordance with magnetic field pattern and characteristics of one or more external sources for which it is designed. The one or more magnetic field generators used within a common system may vary in geometrical shape and number of windings in accordance with calibration data defining pattern of magnetic field generated by one or more external sources in a specific implementation environment.

Generally, the magnetic field generators are configured as coils having selected effective diameter D and number of windings, both of which may be the same or different between the one or more magnetic field generator. The coil may be circular, oval or have any selected generally polygonal shape selected in accordance with magnetic field pattern it generates, and spatial constraints associated with installing position. The one or more magnetic field generators may have arbitrary coil shape.

Typically, a conventional loop antenna arrangement may provide output signal indicative of the variation in magnetic field flux through the sensor (i.e., time derivative of the magnetic field). The present technique may thus utilize one or more magnetic field generators, and specifically generators configured to be operable as combined sensor generator configured with an electronic circuit configured to provide output signal (e.g., voltage output) indicative of magnetic field flux through the sensor. In some examples, this may be provided using a circuit of selected resistance, and self-inductance parameters.

The number of windings, effective diameter and shape of the magnetic field generators typically determine a response function indicative of a relation between electric current transmitted through the magnetic field generator and magnetic field pattern generated thereby. Such response function may be included in pre-stored data and used for determining current profile to be transmitted through the magnetic field generators for generating selected cancelation magnetic field.

Such magnetic field generators may also be used as magnetic field sensors. This is at least partially due to variations in magnetic fields generated by external sources, e.g., of an electric vehicle, which vary magnetic flux through the coil and induces electrical voltage along the coil. Alternatively, or additionally, the system may utilize other types of magnetic field sensors such as hall sensors, or any other type of magnetic field sensor available.

Structure and shape of the magnetic field generators and the magnetic field sensors may be selected in accordance with spatial requirements for installation of the system. For example, the system may be pre-installed within a vehicle (e.g., electric, hybrid or other vehicles) and configured for eliminating, or at least reducing magnetic field in the passengers' compartment of the vehicle. Alternatively, the system may be provided separately and installed in an after-market installation. In this case, the installation may include a calibration process in which magnetic field patterns of the vehicle are mapped during various operation scenarios. This calibration and mapping of magnetic fields generated by the vehicle, are generally pre-stored in the control system and used for predicting magnetic field pattern based on collected sensing data to determine cancelation magnetic field pattern by the system.

Figure 10:
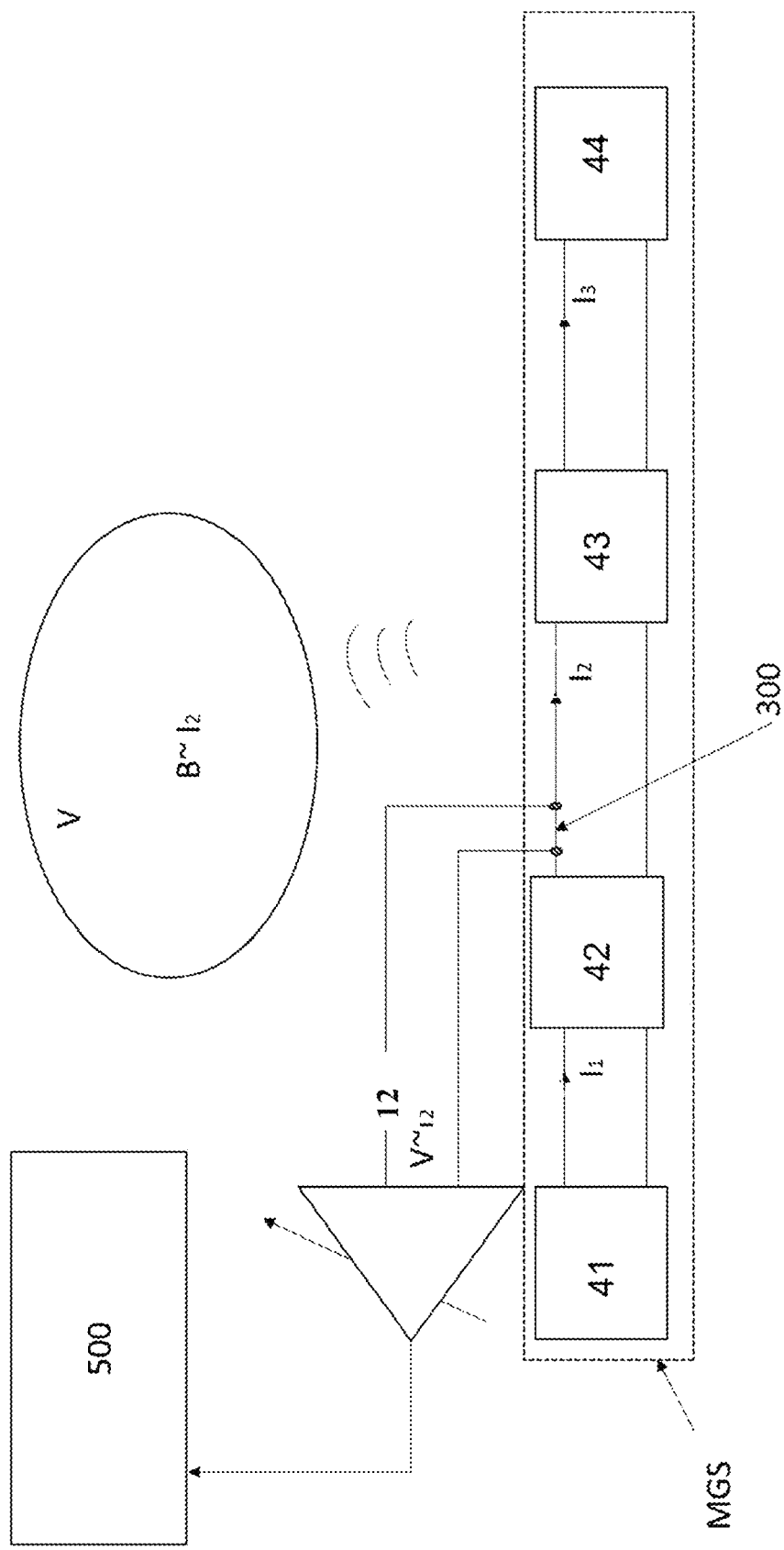
FIG. 10 illustrates a use of sensors for indirect measurement of magnetic field from external source according to some embodiments of the disclosure.

As described above, the present technique utilizes one or more sensors 12 configured to provide data on magnetic field in the selected region V. It is further mentioned above that such the one or more sensors 12 may include sensors connected to external magnetic field sources (e.g., electric motor, current inverter, electric current wires etc.). FIG. 10 exemplifies the use of current sensors (e.g., utilizing galvanic connection in the sense that it connects directly to a current carrying conductive material, where current is indicative of magnetic field generated by one or more sources) mounted directly on current carrying wires associates with magnetic field sources for providing sensing data. In this example, selected external sources are illustrated including sources MGS 41-44. The different sources receive electric currents I1, I2 and I3. An electric current sensor is placed at positioned 300, selected in accordance with correlation between the current and parameters of magnetic field generated by the source. Accordingly, the sensor 12 provides sensing data on current transmitted at position 300, and the control system 500 is configured to utilize calibration data for determining respective magnetic field B in the selected region V in accordance with the measured current. Further, in some embodiments, a current sensor may be connected directly to a current carrying element of the system. For example, an electrically conducting wire may be soldered onto a body of current carrying element, providing a direct probing point for sensing data on current magnitude and direction.

Figure 11:
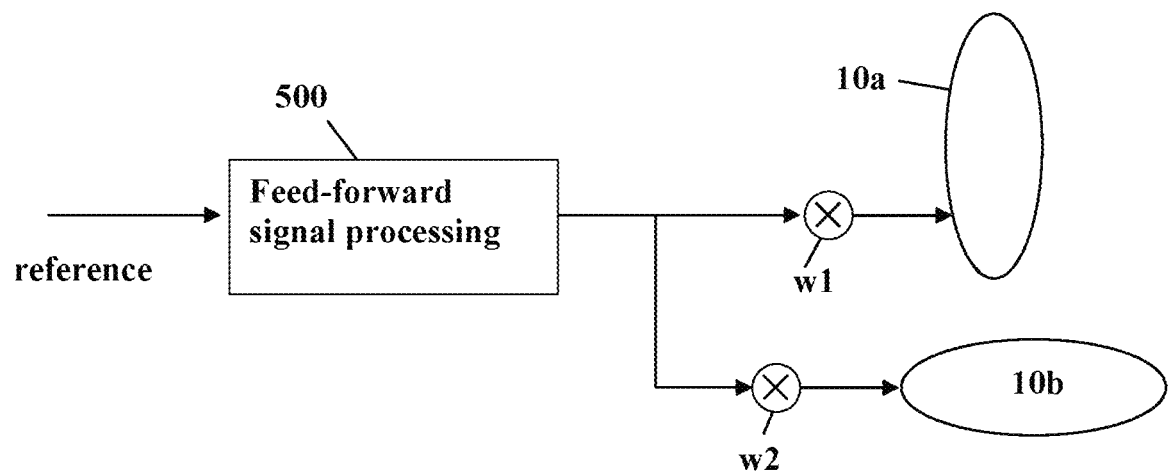
FIG. 11 exemplifies an arrangement of magnetic field generators configured for generating cancellation field based on reference signal according to some embodiments of the disclosure.

Further, as indicated above, the present technique may operate to determine cancellation magnetic field using feedback processing as well as by processing input data to determine anticipated magnetic field based on reference data. In this connection, FIG. 11 illustrates non-feedback operation of the magnetic field cancellation system according to some embodiments of the present disclosure. As shown, the control system 500 may be operated in a non-feedback processing (feed-forward processing) in accordance with reference signals typically representing data on instantaneous magnetic field determined by measurement or based on electrical current data. The control system 500 utilizes pre-stored calibration data to determine amplification gain of the reference data and provides output data indicative of current to be transmitted to each magnetic field generator (e.g., 10a and 10b) for generating cancellation magnetic field. Typically, the reference signal is selected, i.e., by placing of suitable sensor, use of coax cables etc., to minimize any interference between generated cancellation magnetic field and external magnetic field.

In this connection, the control system 500 may utilize one or more processors and memory circuit. In some embodiments however, the control system may utilize a circuit combination of low-pass filter, notch filter (e.g., DC reject notch filter) and integrator for processing reference signal indicative of instantaneous magnetic field and determining corresponding output operational data leading to generation of cancellation magnetic field by the one or more magnetic field generators 10. The integrator is typically used for determining magnetic field data using a magnetic field sensor that generates output signal indicative of variation in a magnetic field (such as an inductance coil, antenna etc.). In such configurations, the reference voltage is proportional to the rate of change of the magnetic field, and the integration operation enables to determine data proportional to the magnetic field. To avoid saturation, the integrator may be set to provide zero mean value, suitable for case of AC or rotating field. Thus, the notch filter may be used to filter out very low frequency signal components, that may accumulate and cause saturation. In some embodiments, the notch bandwidth may be relatively small, e.g., within a few Hz.

It should be noted that generating cancellation magnetic field based on reference signals typically requires calibration to determine response function of the magnetic field generators 10 as well as a connection between reference signal on magnetic field and the actual field within the selected region. Such calibration is illustrated in FIG. 11 by operational coefficients $w_1$ and $w_2$ indicative of amplification gain from reference signal to current transmitted through the magnetic field generators 10.

Generally, generating cancellation field based on reference signal may provide effective cancellation of magnetic field, but requires the cost of pre-calibration, and periodic calibration at times. Such calibration is used to determine gain coefficients for each of the one or more magnetic field generators. The gain coefficients may be determined for each magnetic field generator and for one or more frequency ranges. Typically, the magnetic field cancellation may be directed at cancelling magnetic field within one or more frequency ranges (e.g., DC to 200 KHz, 5 Hz to 200 KHz, between 20 Hz and 1 KHz, 20 Hz and 2 KHz, 20 Hz to 20 kHz, or 20 kHz and higher).

Due to self and mutual inductance, the response function of the magnetic field generators may be frequency dependent. However, using magnetic field generators having increased resistance R may enable enhancement of the bandwidth of magnetic field cancellation. This is based on the frequency response:

$$i = \frac{v}{R + j2\pi fL},$$

where f is the frequency in Hz, $j=\sqrt{-1}$, i is current, v is the voltage and L is inductance of the magnetic field generator.

Generally, in configurations where $2\pi fL$ may be comparable in value to the resistance R, especially at the higher end of the frequency range. Thus, frequency response function of the magnetic field generator may be frequency dependent at higher frequencies. In some embodiments the gain coefficients $w_1$ and $w_2$ may be determined to compensate for phase and amplitude variations at high frequencies, e.g., include complex gain coefficients having real and imaginary components. In some further embodiments, the reference signal may be distorted (or pre-equalized) before amplification and transmission to the magnetic field generator. This may provide current in the magnetic field generator to be proportional to external magnetic field over a selected frequency range, that typically covers the entire operation frequency range of the magnetic field source 40. In some embodiments the frequency band may be between Dc and 200 KHz. or between 5 Hz and 200 KHz, or between DC and 20 KHz, or between 5 Hz and 20 KHz, or between 20 Hz and 1 KHz, or between 20 Hz and 2 KHz, or between 20 Hz to 20 kHz, of at 20 KHz and higher.

The control system may utilize digital processing determined based on analysis of frequency response of the magnetic field generators. For example, given (Laplace) transfer function of a magnetic field generator being $$\frac{I}{V} = \frac{1}{R + Ls},$$

the inverse of this transfer function, is: R+Ls. Thus, the control system may utilize digital processing to convert the transfer function to the z-transform domain, providing:

$$H(z) = R + L * f_s * (1 - z^{-1})$$

here $f_s$ is the sampling rate of the reference signals (e.g., used for the analogue to digital and/or digital to analog conversions). Generally, this conversion may be used assuming that the sampling frequency is significantly greater than the maximum signal frequency.

This transfer function H(z) can be implemented using the recursive difference equation: $y(i)=R*x(i)+L*f_s*(x(i)-x(i-1))$, providing the Pre-Equalization function in the magnetic field cancellation system. In some embodiments, the control system may place a low pass filter downstream to Pre-Equalization processing to filter out high frequency noise that may be generated thereby.

To include mutual inductance between magnetic field generators, the control system may include cross-references between processing channels of different magnetic field generators, e.g., using a Pre-Equalization matrix. Generally for the case of two magnetic field generators having self-inductance L1 and L2 and mutual inductance M, the Pre-Equalization matrix may be of the form $$\begin{bmatrix} (R_1 + L_1 s) & (Ms) \\ (Ms) & (R_2 + L_2 s) \end{bmatrix},$$

Such matrix may be determined for any number of magnetic field generators based on respective mutual and self-inductance properties. Such pre-equalization coefficients can be used to determine cancellation magnetic field output, e.g., using respective differential equations either by analogue processing or and numerical propagation for digital processing.

Generally, in some embodiments, the control system may include pre-stored instructions (e.g., computer readable instructions) indicative of calibration data and frequency response to the one or more magnetic field generators. In some further embodiments, the control system may further include and be configured to execute instructions on adjustment of magnetic field cancellation coefficients for one or more different frequency bands.

Further, it should be noted that frequency dependence may be also associated with signal sampling and/or amplification in addition to inductance associated with magnetic field generators. Such additional sources of frequency dependence are generally included in the pre-equalization parameters of the control system according to the present disclosure. Furthermore, pre-equalization process according to the present disclosure may be adaptive allowing tracking of potential changes in system parameters during operation. Such system parameters may include electrical properties, such as inductance, resistance, and response functions, of one or more amplifiers used in the control system and of the one or more magnetic field generators.

Figure 12:
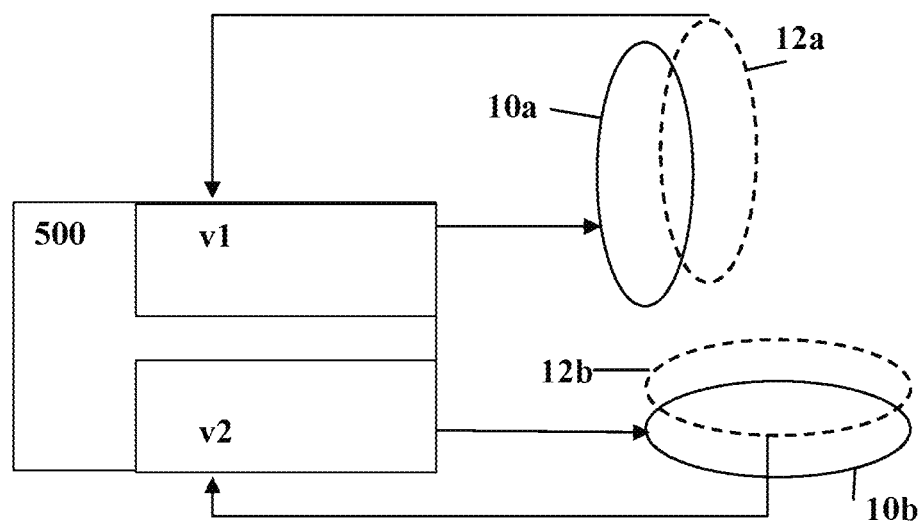
FIG. 12 exemplifies an arrangement of magnetic field generators configured for generating cancellation field by feedback processing according to some embodiments of the disclosure.

FIG. 12 exemplifies a feed-back processing configuration in a specific configuration of FIG. 3A. In this configuration, the magnetic field generated by each of the magnetic field generators 10a and 10b is determined by feedback processing based on sensing data collected by the respective sensors 12a and 12b. Here sensors 12a and 12b are illustrated to be placed next to the magnetic field generators 10a and 10b. However, it should be noted that the location of the sensors 12a and 12b may be determined based on cancellation and mechanical considerations. Generally, it is beneficial to place the sensors in the vicinity of the area in which cancellation is needed. Further, it may also be noted that the sensors 12 need not be the same size and shape as the corresponding magnetic field generators 10. Typically, the processing may utilize a configuration of low-pass filtering. DC reject notch filter, integration additional DC reject notch filter. The output signal is accumulated to build on magnetic field generated prior to each update (typically continuous update).

The feedback coefficients v1 and v2 are chosen to maintain a stable feedback loop while providing sufficient cancellation. In the feedback configuration, differently than the configuration exemplified in FIG. 11, the gain coefficients may be predetermined and do not require calibration. However, as the feedback cancellation operated for canceling magnetic field within the plane of the sensor, and is not calibrated to the space around it, the cancellation efficiency may be lower, leaving some residual magnetic fields in the selected region.

Accordingly, in some embodiments of the present disclosure, the magnetic field cancellation may utilize a combination of feed-back and reference (feed forward) processing for determining the cancellation magnetic field. This configuration requires certain calibration to enable the relatively efficient feed-forward cancellation field, while the feed-back cancellation processing may be used for smoothing magnetic field variations to compensate for calibration errors. Such configuration is exemplified in FIG. 13.

Figure 13:
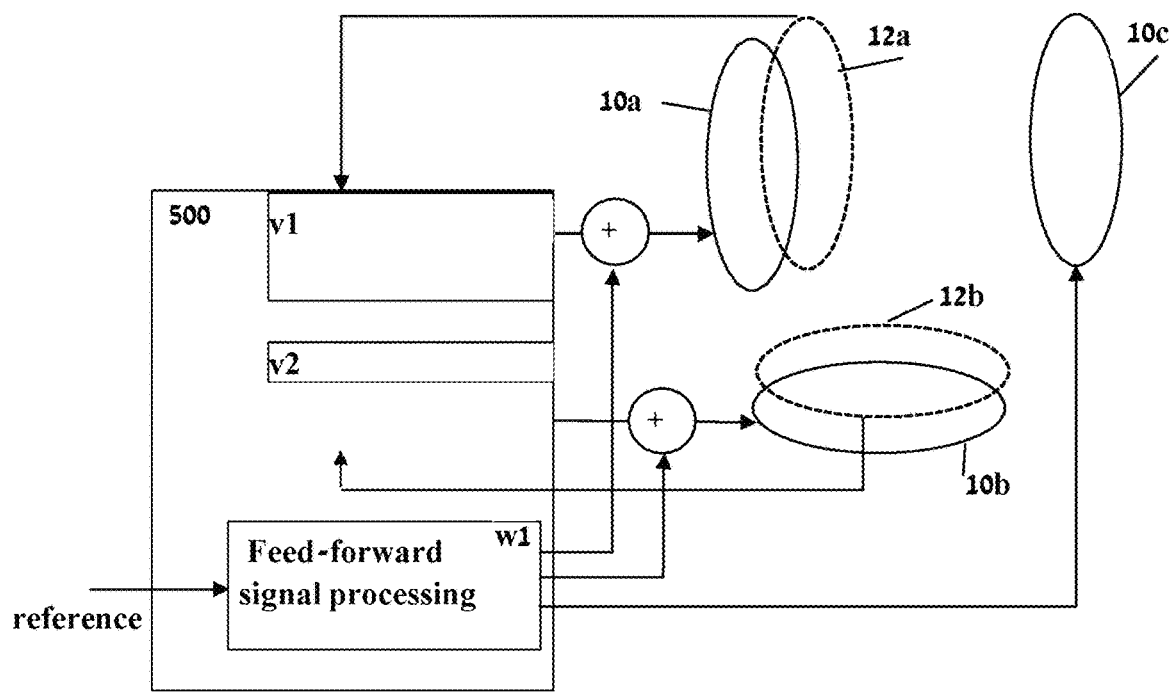
FIG. 13 exemplifies an arrangement of magnetic field generators configured for generating cancellation field using combined reference signal and feedback processing according to some embodiments of the disclosure.

In the exemplary configuration of FIG. 13, the magnetic field cancellation system includes magnetic field sensors 12a and 12b connected via feedback processing loop to magnetic field generators 10a and 10b, as exemplified in FIG. 12 above. Additionally, the control system further provides feed-forward cancellation processing as exemplified in FIG. 11. The magnetic field generator may be shared between the processing techniques using by addition of the total current to be transmitted through the magnetic field generators. Additional magnetic field generators 10c is illustrated to exemplify that one or more magnetic field generators may be operated based on reference data and calibration without direct feedback to magnetic field sensors.

The use of combined system as illustrated in FIG. 13 may enables various operation techniques in accordance with desired operation characteristics. For example, the magnetic field cancellation system may be used operating feed-forward processing and add feedback cancellation field in response to detection of residual field above a selected threshold. Additionally, or alternatively, the different processing techniques may be operated in two different (optionally partially overlapping) sections of the region in which magnetic field is to be eliminated.

An additional parameter associated with magnetic field generator, that is within consideration of the present disclosure relates to size or effective diameter or the magnetic field generators 10. Generally, the magnetic field generators 10 described herein above may be formed of a coil of electrical wiring having certain shape, size and a selected number of windings. These parameters affect the response function of the magnetic field generator, indicating magnitude and form and direction distribution of magnetic field generated thereby.

Figure 14:
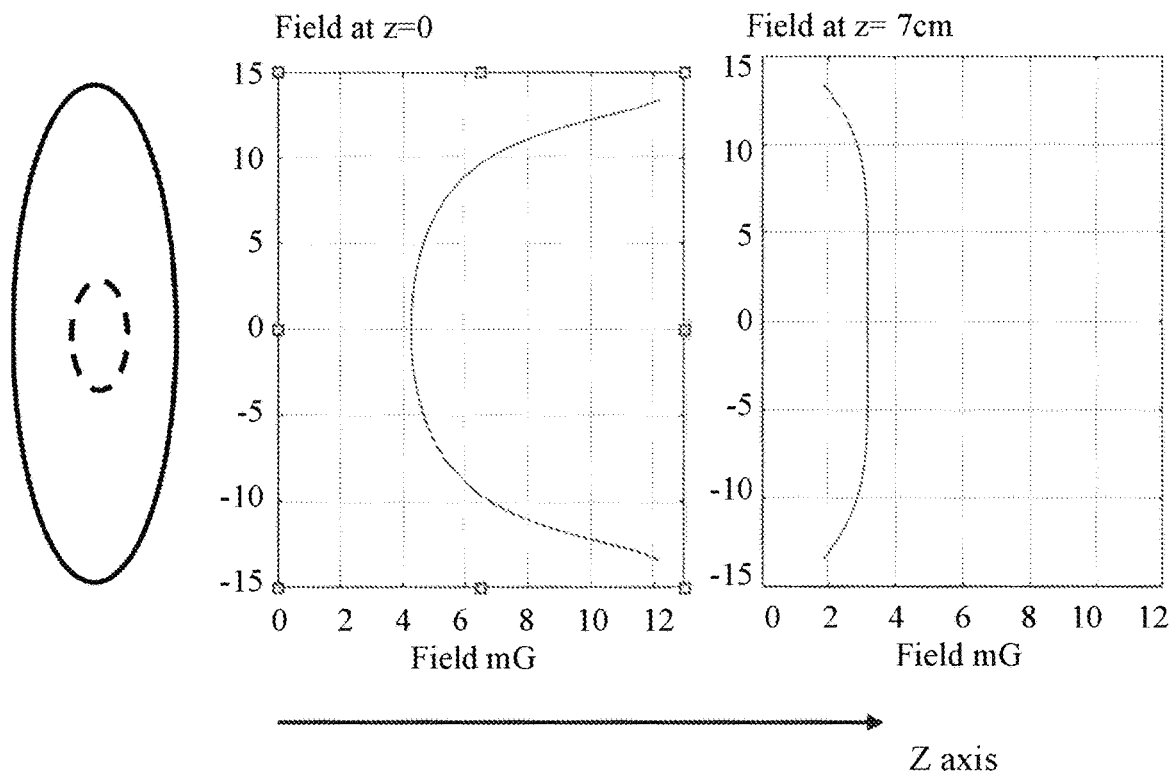
FIG. 14 exemplifies effects of coil diameter in generation of cancellation magnetic field.

FIG. 14 exemplifies magnetic field generated by magnetic field generators of a selected diameter and its variation with distance from the magnetic field generator 10. FIG. 14 illustrates a magnetic field generator 10 having circular configuration with 30 cm diameter and 100 windings of electrical wiring, magnetic field generated thereby as simulated along z axis at plane of the magnetic field generator ($z=0$) and magnetic field simulated at distance of 7 cm along the z axis ($z=7$ cm). The simulated magnetic field is the z component of the magnetic field vector. The z axis here is defined as perpendicular to plane of the magnetic field generator originating from center of the circle defined by the magnetic field generator. In this example, the current in the loop is a test current of 1 mA.

As shown in FIG. 14, flux density of the magnetic field at the plane of the magnetic field generator is non-uniform with a significant dip around the center of the coil. However, at a distance from the magnetic field generator, the magnetic field is weaker, but more uniform. This leads to the inventors' understanding that variation of diameters between magnetic field sensor and generators may enhance field cancellation efficiency.

Accordingly, given coils of similar diameters used as magnetic field sensors and generators, the total flux of magnetic field through the sensor may be canceled. However, at a distance away from the magnetic field generators, residual magnetic field will remain. Alternatively, in some embodiments, the magnetic field sensor may be formed with smaller effective area, e.g., associated with 5 cm diameter as compared to generator coil of 30 cm diameter. In such exemplary configuration, when operated to cancel magnetic field flux detected through the sensor, the magnetic field generator may generate larger magnitude of magnetic field, leading to more efficient cancellation at a distance from the plane of the magnetic field generator. Thus, enabling magnetic field cancellation at desired region, typically at a selected distance from the magnetic field generators.

Figure 15A:
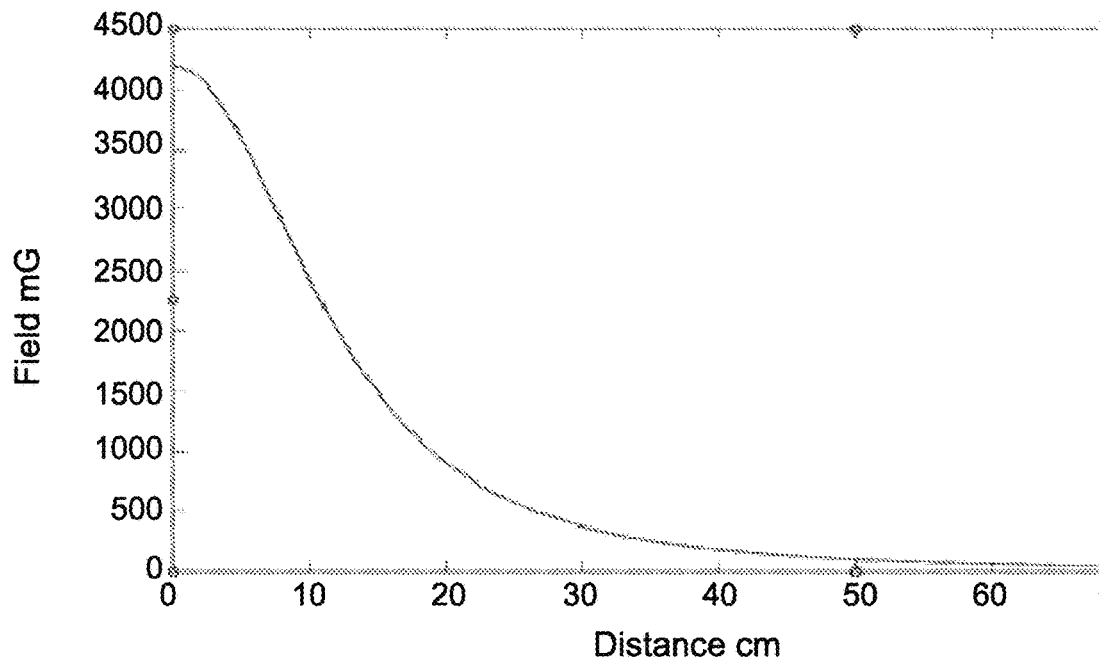
FIGS. 15A and 15B exemplify selection of magnetic field generator diameter for adjustment of magnetic field decay within a selected region.
Figure 15B:
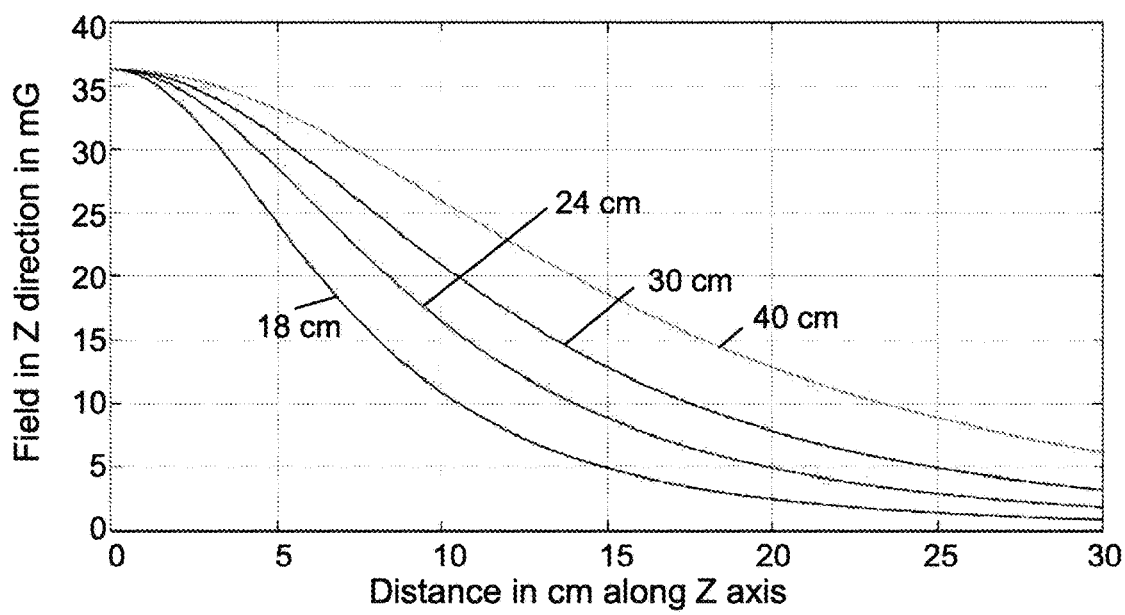

Reference is made to FIGS. 15A and 15B exemplifying decaying magnetic field associated with magnetic field generators of different diameters. FIG. 15A illustrates decaying z vector component of an external magnetic field generated by 100 windings of a coil of diameter of 30 cm carrying a current of 1 Ampere. FIG. 15B shows similar field decay associated with magnetic field generators (coils) of diameters of 18, 24, 30 and 40 cm. As shown, the decay field pattern, or level of field decay with distance varies as a function of diameter of the magnetic field generator. This enables proper selection of magnetic field generator diameter in accordance with location of the region where magnetic field is to be canceled, field source characteristics, and similar selection of sensor measurement area. It should be noted that electric current used in the coils of FIG. 15B may be different between the coils, FIG. 15B is directed to illustrate decay rate of the magnetic field with distance.

Figure 16A:
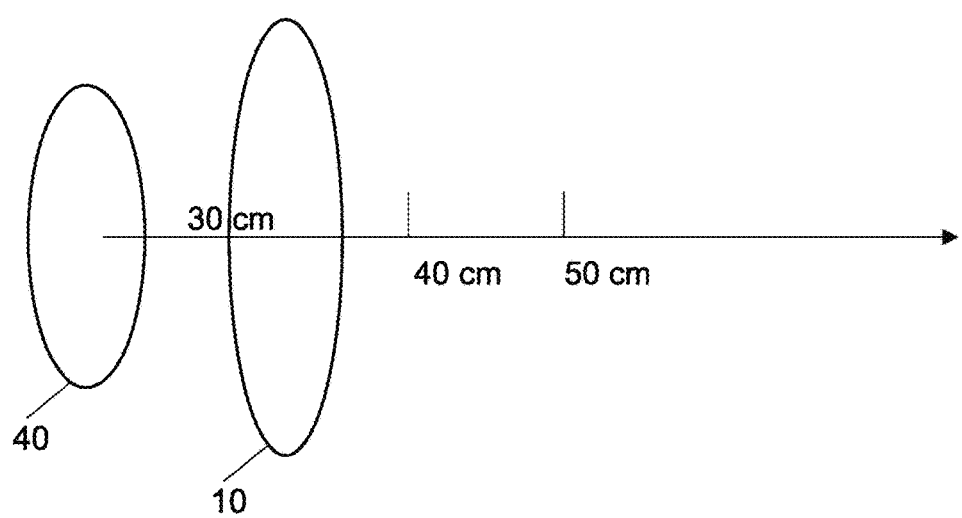
FIGS. 16A to 16C exemplify arrangement of magnetic field generator relative to magnetic field source for cancellation of magnetic field at a selected region.
Figure 16B:
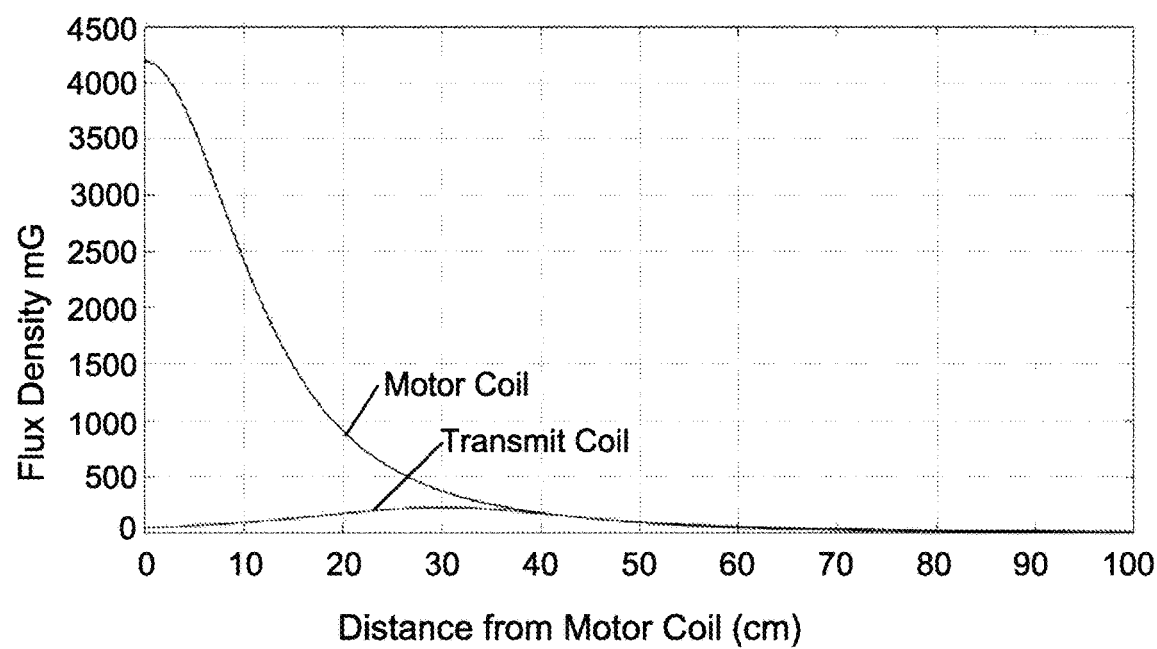
Figure 16C:
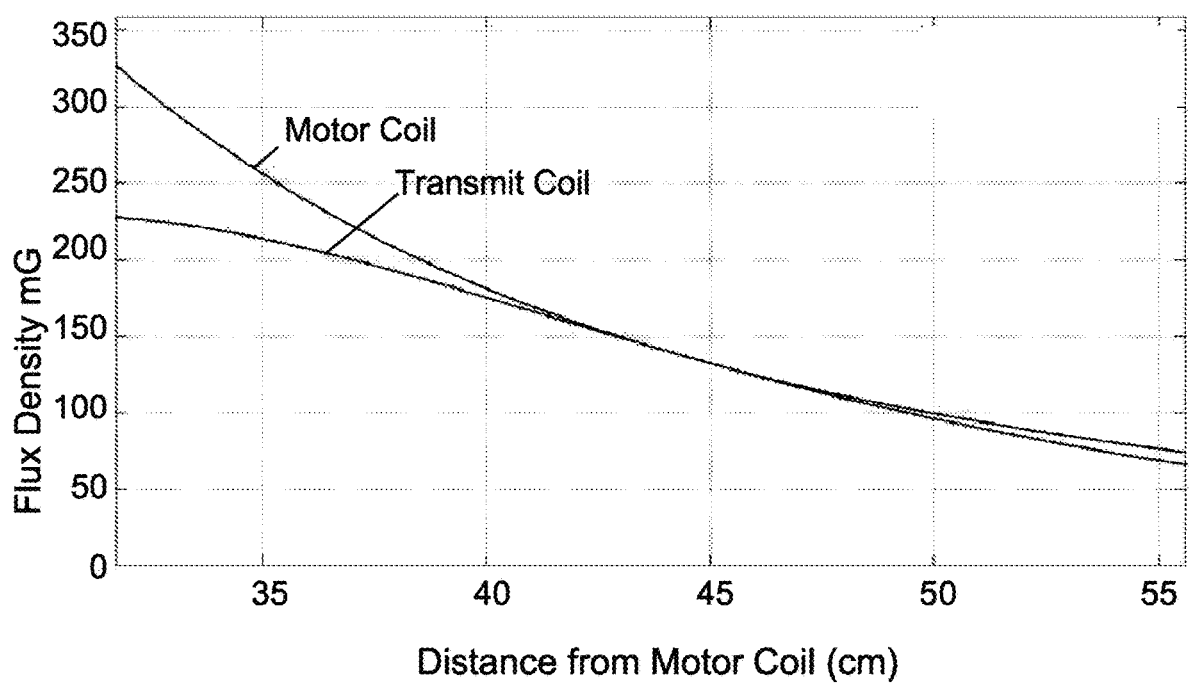

This is exemplified in FIGS. 16A to 16C. FIG. 16A illustrates placement and relative diameters of a magnetic field generator 10 positioned at a selected distance form source of magnetic field illustrated by coil 40. FIG. 16B illustrates z component of magnetic fields generated by the source 40 and the generator 10 along the z axis. FIG. 16C shows a close up on the region about 45 cm from the source 40. As illustrated, by proper selection of magnetic field generator diameter, the slope of cancellation magnetic field may be selected to match that of the magnetic field source, enhancing cancellation efficient.

Generally, in order to provide magnetic field cancellation within a selected region, opposing the magnetic field with field of similar magnitude and opposite direction may be sufficient to cancel the magnetic field at one location. However, by matching slope of decaying magnetic field, the cancellation field may be effective within a selected region where the slopes of magnetic field decay match. Having matched the slope of the external magnetic field as described above, for field cancellation it is necessary to match the magnitude of the field of the magnetic field generator 10 to the magnitude of the external magnetic field at 45 cm from the external source 40. This may be achieved using the feed-forward method by calibrating the magnetic field generator 10 to cancel the source 40 magnetic field at 45 cm from source 40. The same may be achieved using the feedback method by adjusting the diameter of the sensor coil. Also, as seen from FIG. 16B, the magnetic field generators may generate magnetic fields having magnitude much smaller that the of the source, to cancel magnetic fields in a selected region. Thus, the current consumption of the magnetic field generators may be determined to allow efficient operation of the system. It should be noted that the magnetic field generator and/or sensors may or may not be of circular, elliptic of other round shape. Additionally, or alternatively, the magnetic field generators 10 and/or the magnetic field sensors 12 may be of any closed shape that extends within a common plane and/or extends beyond a single geometric plane, the magnetic field generators 10 and/or the magnetic field sensors 12 may be of polygonal shape, combination of polygonal and one or more circle portions, or any other selected shape that provide efficient magnetic field sensing/cancellation within the requirements of a selected application of the present disclosure.

Figure 17:
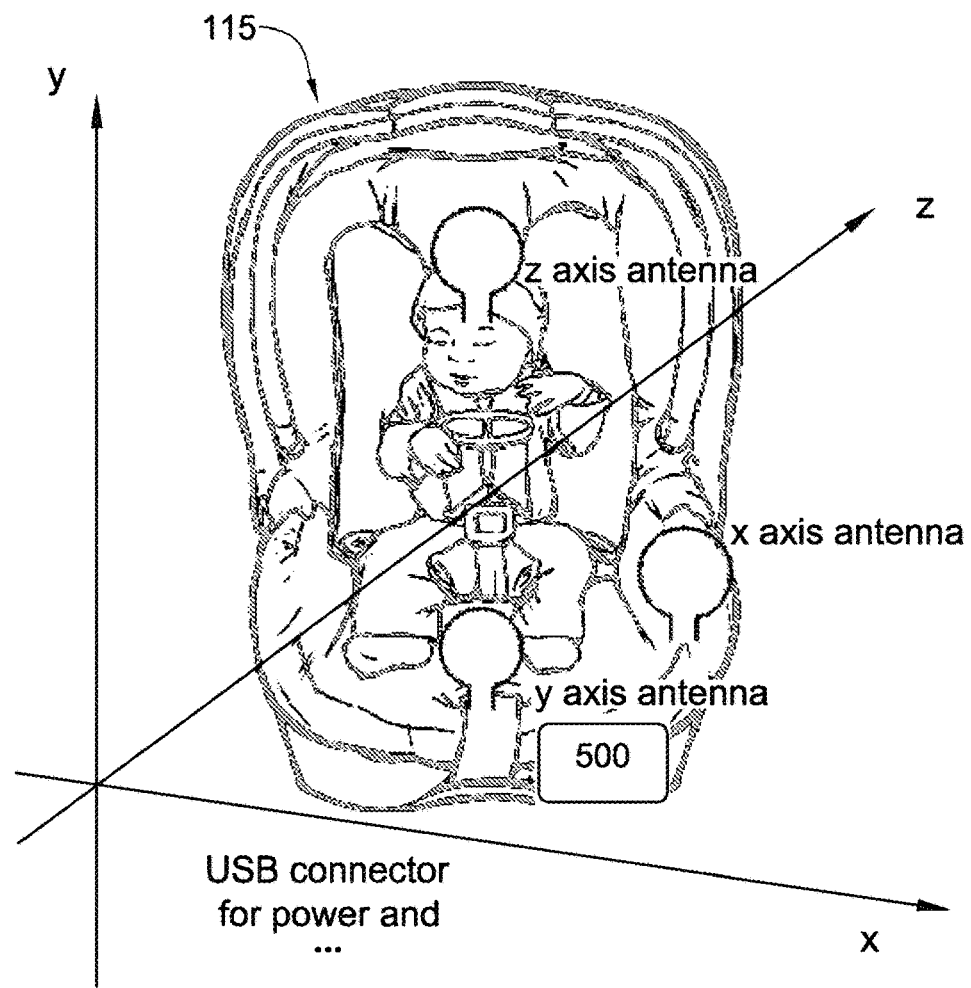
FIG. 17 exemplifies a child safety seat carrying a system according to some embodiments of the present disclosure.

The system of the present technique may also be pre-installed in one or more add-ons to be placed within the vehicle. FIG. 17 exemplifies a system according to some embodiments of the present technique, installed in a child safety seat 115. In this case the system includes a control system 500, and three or more magnetic field generators oriented along three intersecting axes, exemplified by antennas aligned along axes X. Y and Z in the figure. The system may be connectable to vehicle power supply by any suitable connector, including e.g., a USB style connector, or other connector types in accordance with vehicle manufacturer standards. As indicated above, the control system 500, may include one or more processors and memory utilities, and may utilize digital and/or analog processing of collected sensing data to determine and generate cancelation magnetic field.

Figure 18:
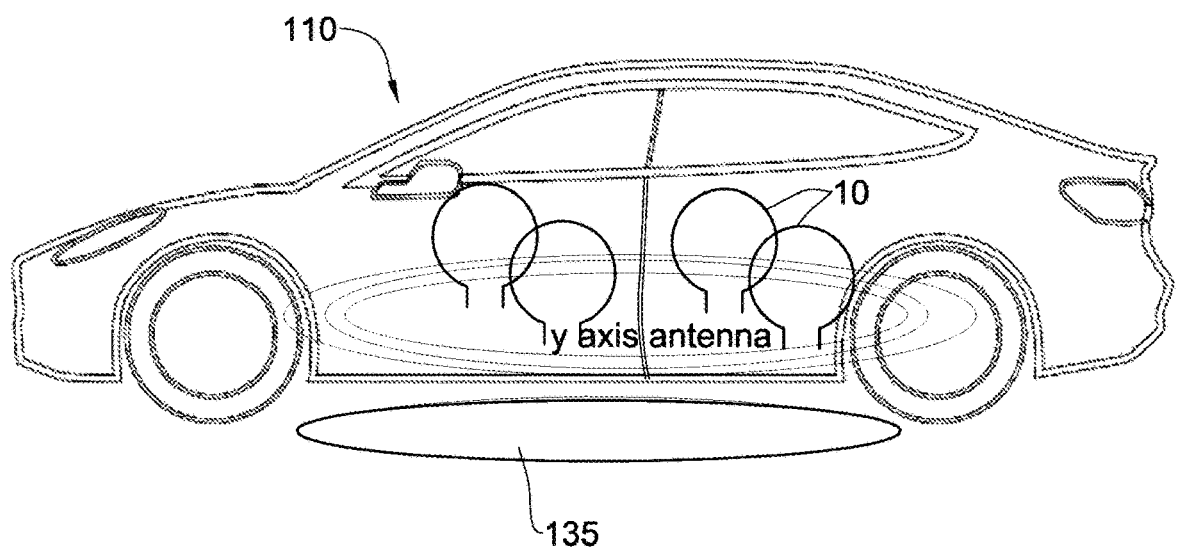
FIG. 18 illustrates a use of the present technique in an electric vehicle utilizing wireless charging.

An additional configuration is illustrated in FIG. 18. In this configuration electric vehicle 110 is configured to utilize wireless charging using wireless charging pad 135. Generally wireless charging utilizes magnetic induction and transmission of electrical energy using variation of magnetic fields through electrical conductors. In this configuration, the one or more magnetic field generators 10 may be positioned with respect to charging pad, illustrated herein as y axis. This configuration is generally directing at reducing magnetic field within the vehicle during charging.

Thus, the present disclosure provides a magnetic field cancellation technique. Generally, cancellation of magnetic fields may utilize one or more of the control techniques described herein, operating separately or in combination of different methods. For example, feedforward cancellation (estimating externally generated magnetic field) may be applied to a selection region while other regions may utilize feedback cancellation techniques.

Additional configurations of the present technique may be mounted on various other elements in different scenarios. For example, the system of the present technique may be implemented within a bed, storage cabinets, computer/server room etc. Accordingly, the present technique provides a system for adaptively and actively reducing magnetic fields within a selected region, where the magnetic field is generally spatially not uniform and generally time varying. The present technique utilizes sensing data on magnetic field in the region and generating of cancelation magnetic field using one or more magnetic field generators in the region.

It is to be noted that the various features described in the various embodiments can be combined according to all possible technical combinations.

It is to be understood that the invention is not limited in its application to the details set forth in the description contained herein or illustrated in the drawings. The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based can readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

The invention claimed is:

1. A system for reducing a time-varying undesired magnetic field in a passenger compartment of a vehicle, the system comprising:

at least one magnetic field source in the vehicle configured to transmit time-varying currents resulting in the time-varying undesired magnetic field in the passenger compartment, wherein the passenger compartment includes a selected region suitable for presence of people;

at least one sensor configured to detect at least a portion of the time-varying undesired magnetic field in the selected region and to provide associated sensing data indicative of at least the portion of the time-varying undesired magnetic field in the selected region;

at least one magnetic field generator configured to generate a time-varying cancellation magnetic field in the selected region;

at least one circuit configured to:
receive the associated sensing data indicative of the at least the portion of the time-varying magnetic field;
determine the time-varying cancellation magnetic field from the associated sensing data; and
transmit signals to the at least one magnetic field generator to thereby cause the at least one magnetic field generator to generate the time-varying cancellation magnetic field for at least reducing the time-varying undesired magnetic field, wherein the at least one sensor, the at least one magnetic field generator, and the at least one circuit are configured as an integral part of the vehicle.

2. The system of claim 1, wherein the at least one circuit includes at least one processor.

3. The system of claim 1, wherein the at least one circuit includes analog processing circuitry.

4. The vehicle of claim 1, wherein the at least one magnetic field generator includes a coil having a plurality of windings.

5. The vehicle of claim 4, wherein the coil includes high permeability metal.

6. The vehicle of claim 1, wherein the time-varying cancelation magnetic field includes a pattern configured to match the time-varying undesired magnetic field emitted into the selected region by the at least one magnetic field source.

7. The vehicle of claim 1, wherein at least a portion of a system including the at least one magnetic field generator, the at least one magnetic field sensor, and the at least one circuit, is located in a rear seat of the vehicle.

8. The vehicle of claim 1, wherein receiving at least the portion of the time-varying undesired magnetic field emitted into the selected region is performed simultaneously with generating the time-varying cancelation magnetic field for at least reducing the time-varying undesired magnetic field.

9. The vehicle of claim 1, wherein at least one of the at least one magnetic field sensor and at least one of the at least one magnetic field generator spatially overlap.

10. The vehicle of claim 1, wherein at least one of the at least one magnetic field sensor and at least one of the at least one magnetic field generator are included in a common unit.

11. The vehicle of claim 1, further comprising a safety seat, wherein the least one magnetic field generator is positioned around a selected region of the safety seat, and wherein the at least one sensor is configured to provide sensing data on the time-varying undesired magnetic fields in at least a portion of the selected region of the safety seat.

12. The vehicle of claim 1, wherein the at least one magnetic field generator includes a plurality of magnetic field generators positioned at two sides of the selected region.

13. The vehicle of claim 1, wherein the at least one circuit is adapted for receiving input reference data indicative of magnetic field at one or more positions and processing the reference data for estimating magnetic field variations within the selected region in accordance with pre-stored calibration data.

14. The vehicle of claim 13, wherein determining the time-varying cancellation magnetic field from the associated sensing data includes feedback processing of magnetic field data in accordance with the associated sensing data and utilizing an estimation based on the input reference data and the pre-stored calibration data.

15. The vehicle of claim 1, wherein the at least one circuit is configured to integrate voltage signals provided by the at least one sensor to thereby determine the associated sensing data indicative of the at least the portion of the time-varying magnetic field.

16. The vehicle of claim 1, wherein the at least one circuit is configured to determine an output current for transmitting to the at least one magnetic field generator based on an electrical current induced through the at least one magnetic field generator in response to variations in magnetic field flux through the at least one magnetic field generator, wherein the variations in magnetic field flux are associated with variations in the time-varying undesired magnetic field and variations in a time-varying cancellation magnetic field generated by at least one additional magnetic field generator.

17. The vehicle of claim 1, further comprising memory for storing pre-stored data indicative of a time-varying pattern of the time-varying undesired magnetic field, wherein the at least one circuit is configured to process the associated sensing data received from the at least one sensor during a sensing time period, determine an estimation of time-varying undesired magnetic field using the pre-stored field data during a cancelling time period subsequent to the sensing time period, to thereby determine the time-varying cancellation magnetic field for at least reducing the time-varying undesired magnetic field during the cancelling time period.

18. The vehicle of claim 17, wherein said the pre-stored data indicative of the time-varying pattern of the time-varying undesired magnetic field includes data indicative of a rotating magnetic field portion.

19. A method for reducing a time-varying undesired magnetic field in a passenger compartment of a vehicle, the method comprising:
transmitting time-varying currents resulting in the time-varying undesired magnetic field in the passenger compartment, wherein the passenger compartment includes a selected region suitable for presence of people;
detecting, by at least one magnetic field sensor, at least a portion of the time-varying undesired magnetic field in the selected region;
receiving, from the at least one magnetic field sensor, associated sensing data indicative of the at least the portion of the time-varying magnetic field in the selected region;
determining a time-varying cancellation magnetic field from the associated sensing data; and
transmitting signals to the at least one magnetic field generator to thereby cause the at least one magnetic field generator to generate the time-varying cancellation magnetic field for at least reducing the time-varying undesired magnetic field, wherein at least one of the at least one magnetic field sensor and at least one of the at least one magnetic field generator are included in a common unit.

20. A computer readable medium containing computer readable instructions that when executed by at least one processor cause the at least one processor to perform operations for reducing a time-varying undesired magnetic field in a passenger compartment of a vehicle, the operations comprising:
transmitting time-varying currents resulting in the time-varying undesired magnetic field in the passenger compartment, wherein the passenger compartment includes a selected region suitable for presence of people;
detecting, by at least one magnetic field sensor, at least a portion of the time-varying undesired magnetic field in the selected region;
receiving, from the at least one magnetic field sensor, associated sensing data indicative of the at least the portion of the time-varying magnetic field in the selected region;
determining a time-varying cancellation magnetic field from the associated sensing data; and
transmitting signals to the at least one magnetic field generator to thereby cause the at least one magnetic field generator to generate the time-varying cancellation magnetic field for at least reducing the time-varying undesired magnetic field, wherein the at least one magnetic field generator includes a plurality of magnetic field generators positioned at two sides of the selected region.

* * * * *